(12) United States Patent
Yamada et al.

(10) Patent No.: US 10,659,006 B2
(45) Date of Patent: May 19, 2020

(54) RESONATOR ELEMENT, RESONATOR, ELECTRONIC DEVICE, ELECTRONIC APPARATUS, AND MOVING OBJECT

(71) Applicant: SEIKO EPSON CORPORATION, Tokyo (JP)

(72) Inventors: Akinori Yamada, Ina (JP); Shuhei Yoshida, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 546 days.

(21) Appl. No.: 15/615,418

(22) Filed: Jun. 6, 2017

(65) Prior Publication Data

US 2017/0272054 A1  Sep. 21, 2017

Related U.S. Application Data

(63) Continuation of application No. 14/313,468, filed on Jun. 24, 2014, now Pat. No. 9,705,472.

(30) Foreign Application Priority Data

Jun. 24, 2013  (JP) .................................. 2013-131936

(51) Int. Cl.
*H03H 9/21*  (2006.01)
*H03H 9/215*  (2006.01)
*H03H 9/05*  (2006.01)
*H03H 3/04*  (2006.01)
*H03H 3/02*  (2006.01)

(52) U.S. Cl.
CPC ............ *H03H 9/21* (2013.01); *H03H 9/0542* (2013.01); *H03H 2003/028* (2013.01); *H03H 2003/0407* (2013.01)

(58) Field of Classification Search
CPC .. H03H 9/21; H03H 9/0542; H03H 2003/028; H03H 2003/0407
USPC ......................................................... 310/370
See application file for complete search history.

(56) References Cited

U.S. PATENT DOCUMENTS

| 5,691,595 | A  | 11/1997 | Tomikawa et al. |
| 6,675,651 | B2 | 1/2004  | Yanagisawa et al. |
| 8,427,035 | B2 | 4/2013  | Yamada |

(Continued)

FOREIGN PATENT DOCUMENTS

| EP | 1732 217 A1 | 12/2006 |
| EP | 1732 220 A1 | 12/2006 |

(Continued)

OTHER PUBLICATIONS

Sep. 24, 2015 Office Action issued in U.S. Appl. No. 14/582,629.

*Primary Examiner* — Thomas M Dougherty
(74) *Attorney, Agent, or Firm* — Oliff PLC

(57) ABSTRACT

A resonator element includes: a base portion including a first end surface that faces a first direction and a second end surface that faces a direction opposite to the first direction, a first vibrating arm that is provided integrally with the base portion and is connected to the first end surface; and a second vibrating arm that is provided integrally with the base portion along the first vibrating arm and is connected to the first end surface. When the shortest distance between the first end surface and the second end surface is Wb and an effective width between the shortest distance Wb and the base portion is We, $0.81 \leq Wb/We \leq 1.70$ is satisfied.

20 Claims, 13 Drawing Sheets

(56) References Cited

U.S. PATENT DOCUMENTS

| | | |
|---|---|---|
| 9,413,332 B2 | 8/2016 | Yamada |
| 9,425,768 B2 * | 8/2016 | Yamada .................. H03H 9/21 |
| 10,326,427 B2 * | 6/2019 | Yamada .................. H03B 5/32 |
| 2003/0067248 A1 | 4/2003 | Dalla Piazza et al. |
| 2005/0062368 A1 | 3/2005 | Hirasawa et al. |
| 2010/0117492 A1 | 5/2010 | Kawashima |
| 2010/0156237 A1 | 6/2010 | Ichikawa et al. |
| 2010/0164331 A1 | 7/2010 | Yamada |
| 2010/0171397 A1 | 7/2010 | Yamada |
| 2010/0244989 A1 | 9/2010 | Furuhata et al. |
| 2011/0018399 A1 | 1/2011 | Murata et al. |
| 2011/0109205 A1 | 5/2011 | Yamada |
| 2011/0227672 A1 | 9/2011 | Yamada |
| 2014/0167870 A1 | 6/2014 | Yamada |
| 2014/0265736 A1 * | 9/2014 | Yamada .................. H03H 9/21 310/370 |
| 2014/0375178 A1 | 12/2014 | Yamada et al. |
| 2016/0182012 A1 * | 6/2016 | Lim .................. H03H 9/21 310/370 |
| 2017/0310333 A9 * | 10/2017 | Draxelmayr ........ H03M 1/1052 |
| 2018/0083596 A1 * | 3/2018 | Sato .................. H03H 9/21 |

FOREIGN PATENT DOCUMENTS

| | | |
|---|---|---|
| EP | 2071 721 A1 | 6/2009 |
| JP | 2002-141770 A | 5/2002 |
| JP | 2003-163568 A | 6/2003 |
| JP | 2006-345517 A | 12/2006 |
| JP | 2006-345519 A | 12/2006 |
| JP | 2008-177723 A | 7/2008 |
| JP | 2009-147935 A | 7/2009 |
| JP | 2009-164775 A | 7/2009 |
| JP | 2010-119128 A | 5/2010 |
| JP | 2010157933 A | 7/2010 |
| JP | 2010-183138 A | 8/2010 |
| JP | 2010171965 A | 8/2010 |
| JP | 2010171966 A | 8/2010 |
| JP | 2010178064 A | 8/2010 |
| JP | 2010-226608 A | 10/2010 |
| JP | 2010-226610 A | 10/2010 |
| JP | 2010-252302 A | 11/2010 |
| JP | 2010-278831 A | 12/2010 |
| JP | 2011-015101 A | 1/2011 |
| JP | 2011-019159 A | 1/2011 |
| JP | 2011-124976 A | 6/2011 |
| JP | 2011-193436 A | 9/2011 |
| JP | 2011-199331 A | 10/2011 |
| JP | 2012-135021 A | 7/2012 |
| JP | 2012-147329 A | 8/2012 |
| JP | 2012-186679 A | 9/2012 |
| JP | 2012-227961 A | 11/2012 |
| JP | 2014-121039 A | 6/2014 |
| WO | 2009/116523 A1 | 9/2009 |

\* cited by examiner

| Wb [μm] | f [kHz] | Q | We [μm] | Wb / We |
|---|---|---|---|---|
| 25.0 | 20.101 | 1,484 | 34.0 | 0.74 |
| 35.0 | 25.382 | 3,434 | 47.6 | 0.73 |
| 40.0 | 27.104 | 4,639 | 53.8 | 0.74 |
| 50.0 | 29.359 | 6,672 | 62.1 | 0.81 |
| 60.0 | 30.643 | 7,867 | 66.0 | 0.91 |
| 70.0 | 31.401 | 8,467 | 67.6 | 1.03 |
| 80.0 | 31.873 | 8,823 | 68.5 | 1.17 |
| 90.0 | 32.176 | 8,888 | 68.5 | 1.31 |
| 100.0 | 32.381 | 8,952 | 68.5 | 1.46 |
| 150.0 | 32.793 | 9,011 | 68.3 | 2.20 |
| 200.0 | 32.895 | 9,018 | 68.2 | 2.93 |

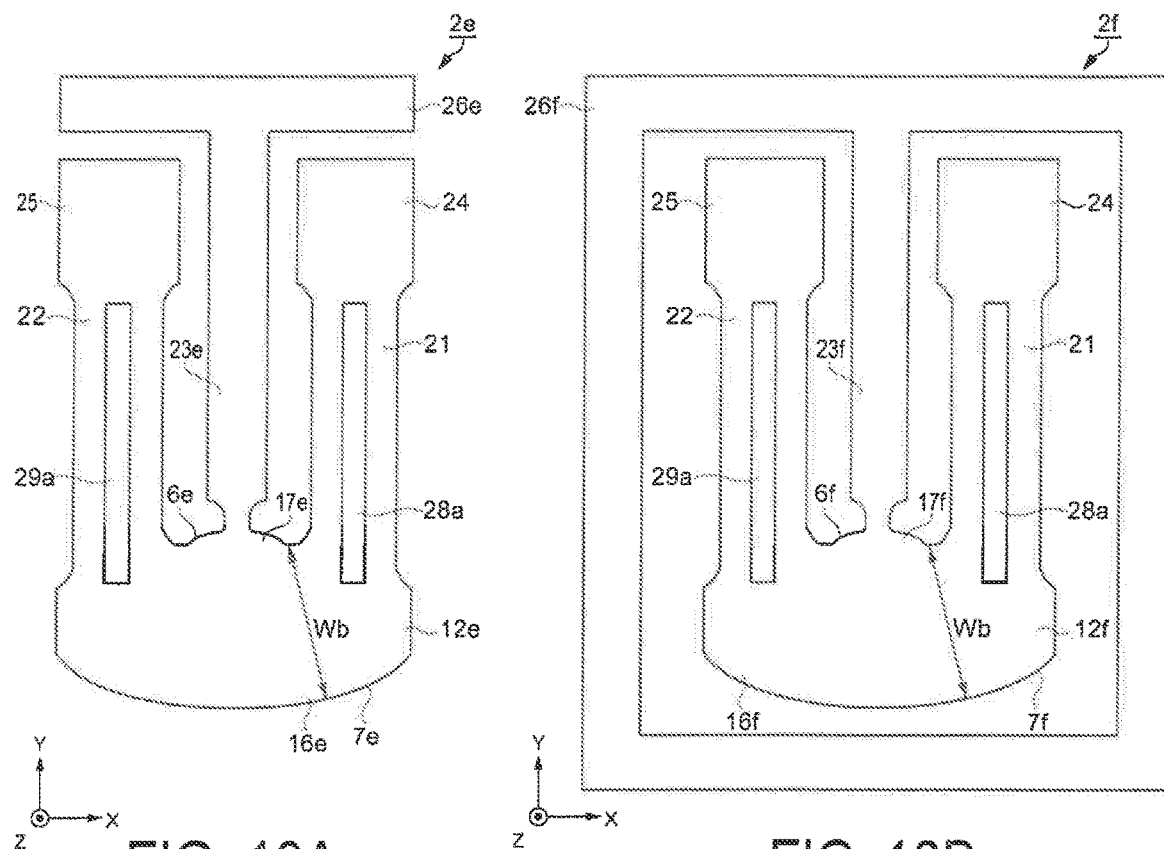
FIG. 10A
FIG. 10B
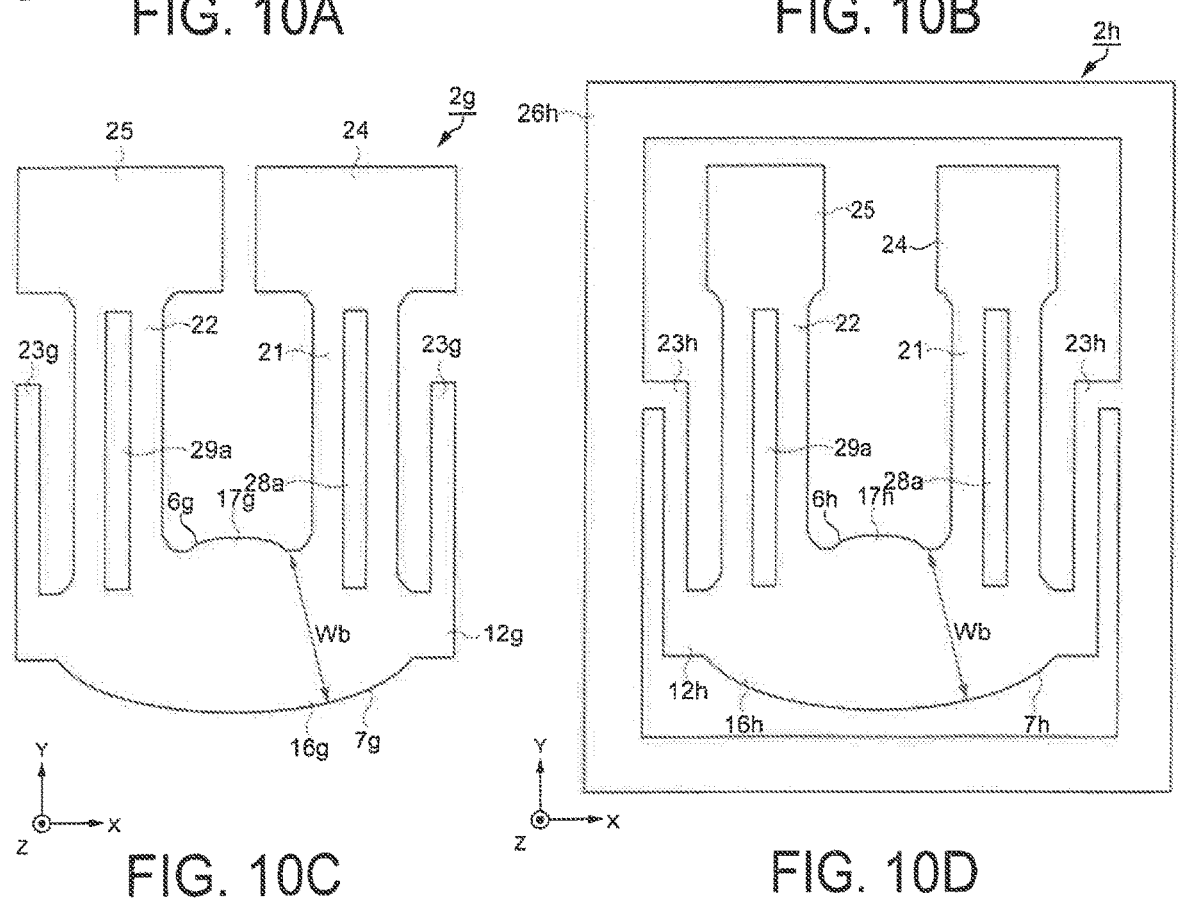
FIG. 10C
FIG. 10D

RESONATOR ELEMENT, RESONATOR, ELECTRONIC DEVICE, ELECTRONIC APPARATUS, AND MOVING OBJECT

CROSS REFERENCE

This application is a continuation of U.S. Ser. No. 14/313,468, filed Jun. 24, 2014. The entire disclosure of Japanese Patent Application No. 2013-131936 filed Jun. 24, 2013 is expressly incorporated by reference herein.

BACKGROUND

1. Technical Field

The present invention relates to a resonator element, a resonator, an electronic device, an electronic apparatus, and a moving object.

2. Related Art

In a small information device, such as a hard disk drive (HDD), a mobile computer, or an IC card, or a mobile communication apparatus, such as a mobile phone, a smart phone, or a tablet terminal, an electronic device, such as a resonator or an oscillator, has been widely used as a device for providing a timing signal or a synchronizing signal.

A device in which a resonator element is accommodated in a package has been known as the resonator or the oscillator (for example, see JP-A-2002-141770). The resonator element disclosed in JP-A-2002-141770 includes a base portion, two vibrating arms which protrude from a base portion so as to be parallel to each other, and a supporting arm which protrudes from the base portion and is disposed between the two vibrating arms, in order to reduce the overall length of the resonator element and to reduce a size.

However, in the resonator element disclosed in JP-A-2002-141770, when the dimensions of the base portion (the width of the base portion in the direction in which the vibrating arm protrudes) are reduced to 40 μm in order to further reduce the size, the Q-value is significantly reduced to 4,639.

SUMMARY

An advantage of some aspects of the invention is to solve at least a part of the problems described above, and the invention can be implemented as the following forms or application examples.

Application Example 1

This application example is directed to a resonator element including: a base portion including a first end surface and a second end surface which is provided on a rear side of the first end surface; and a pair of vibrating arms that protrude from the first end surface of the base portion in a first direction and are arranged in a line in a second direction perpendicular to the first direction. When the shortest distance between the first end surface and the second end surface is Wb, the following are satisfied.

$$Q=\{(\rho \times C_p)/(c \times \alpha^2 \times \Theta)\} \times [\{1+(2 \times \rho \times C_p \times We^2 \times f/(\pi \times k))^2\}/(2 \times \rho \times C_p \times We^2 \times f/(\pi \cdot k))]$$

$0.81 \leq Wb/We \leq 1.70$ (where Q is a Q-value of the resonator element, f is a vibration frequency [Hz] of the resonator element, We is an effective width [m], ρ is mass density [kg/m³], $C_p$ is heat capacity per unit mass at constant pressure [J/(kg×K)], c is an elastic constant [N/m²] related to a direction perpendicular to the direction of Wb in the plane, α is a thermal expansion coefficient [1/K] related to the direction perpendicular to the direction of Wb in the plane, Θ is an environmental temperature [K], and k is thermal conductivity [W/(m×K)] related to the direction of Wb)

According to this application example, since the value of Wb/We satisfies the relationship $0.81 \leq Wb/We \leq 1.70$, it is possible to reduce thermoelastic loss caused by a reduction in the distance between the first end surface and the second end surface of the base portion and to obtain a resonator element that has a high Q-value which enables an oscillation circuit to stably oscillate and has a smaller size than the resonator element according to the related art.

Application Example 2

This application example is directed to the resonator element according to the application example described above, wherein $0.91 \leq Wb/We \leq 1.30$ is satisfied.

According to this application example, since the value of Wb/We satisfies the relationship $0.91 \leq Wb/We \leq 1.30$, it is possible to reduce thermoelastic loss caused by a reduction in the distance between the first end surface and the second end surface of the base portion and to obtain a resonator element that has a high Q-value which enables an oscillation circuit to stably oscillate and has a smaller size than the resonator element according to the related art.

Application Example 3

This application example is directed to the resonator element according to the application example described above, wherein $1.00 \leq Wb/We \leq 1.20$ is satisfied.

According to this application example, since the value of Wb/We satisfies the relationship $1.00 \leq Wb/We \leq 1.20$, it is possible to reduce thermoelastic loss caused by a reduction in the distance between the first end surface and the second end surface of the base portion and to obtain a resonator element that has a high Q-value which enables an oscillation circuit to stably oscillate and has a smaller size than the resonator element according to the related art.

Application Example 4

This application example is directed to the resonator element according to the application example described above, wherein a supporting arm protrudes from the base.

According to this application example, since the supporting arm protrudes from the base portion, it is possible to reduce vibration leakage caused by the bending vibration of the vibrating arm. Therefore, it is possible to obtain a resonator element with a high Q-value.

Application Example 5

This application example is directed to the resonator element according to the application example described above, wherein the supporting arm protrudes from the first end surface of the base portion between a first vibrating arm and a second vibrating arm.

According to this application example, since the supporting arm is arranged between the first vibrating arm and the second vibrating arm, the resonator element is supported and fixed by a central portion of the resonator element. Therefore, it is possible to reduce the overall length of the resonator element and to reduce the size of the resonator element.

Application Example 6

This application example is directed to the resonator element according to the application example described above, wherein a pair of supporting arms are arranged such that the first vibrating arm and the second vibrating arm are interposed therebetween.

According to this application example, since the pair of supporting arms are arranged such that the first vibrating arm and the second vibrating arm are interposed therebetween, it is possible to obtain a resonator element with high vibration resistance and high drop impact resistance.

Application Example 7

This application example is directed to a resonator including the resonator element according to the application example described above and a container that accommodates the resonator element.

According to this application example, it is possible to obtain a resonator including a resonator element with a small size and a high Q-value.

Application Example 8

This application example is directed to the resonator according to the application example described above, wherein the inside of the container is a vacuum.

According to this application example, since the internal space is a vacuum, it is possible to reduce viscosity resistance. Therefore, the resonator element can stably vibrate.

Application Example 9

This application example is directed to an electronic device including the resonator element according to the application example described above and a circuit.

According to this application example, the electronic device can be formed by the resonator element with a small size and a high Q-value and an oscillation circuit which stably excites the resonator element. Therefore, it is possible to obtain an electronic device with a small size and stable oscillation characteristics.

Application Example 10

This application example is directed to an electronic apparatus including the resonator element according to the application example described above.

According to this application example, since the resonator element with a small size and a high Q-value is used, it is possible to obtain an electronic apparatus including an electronic device with a small size and stable oscillation characteristics.

Application Example 11

This application example is directed to a moving object including the resonator element according to the application example described above.

According to this application example, the resonator which has a small size and high frequency reproducibility or excellent frequency aging characteristics and includes the resonator element with a small size and a high Q-value can be used. Therefore, it is possible to form a moving object including, for example, a stable and accurate electronic control unit.

BRIEF DESCRIPTION OF THE DRAWINGS

The invention will be described with reference to the accompanying drawings, wherein like numbers reference like elements.

FIG. 10A is a plan view illustrating Modification Example 5 of the resonator element used in the resonator according to the embodiment of the invention.

FIG. 10B is a plan view illustrating Modification Example 6 of the resonator element used in the resonator according to the embodiment of the invention.

FIG. 10C is a plan view illustrating Modification Example 7 of the resonator element used in the resonator according to the embodiment of the invention.

FIG. 10D is a plan view illustrating Modification Example 8 of the resonator element used in the resonator according to the embodiment of the invention.

DESCRIPTION OF EXEMPLARY EMBODIMENTS

Figure 1A:
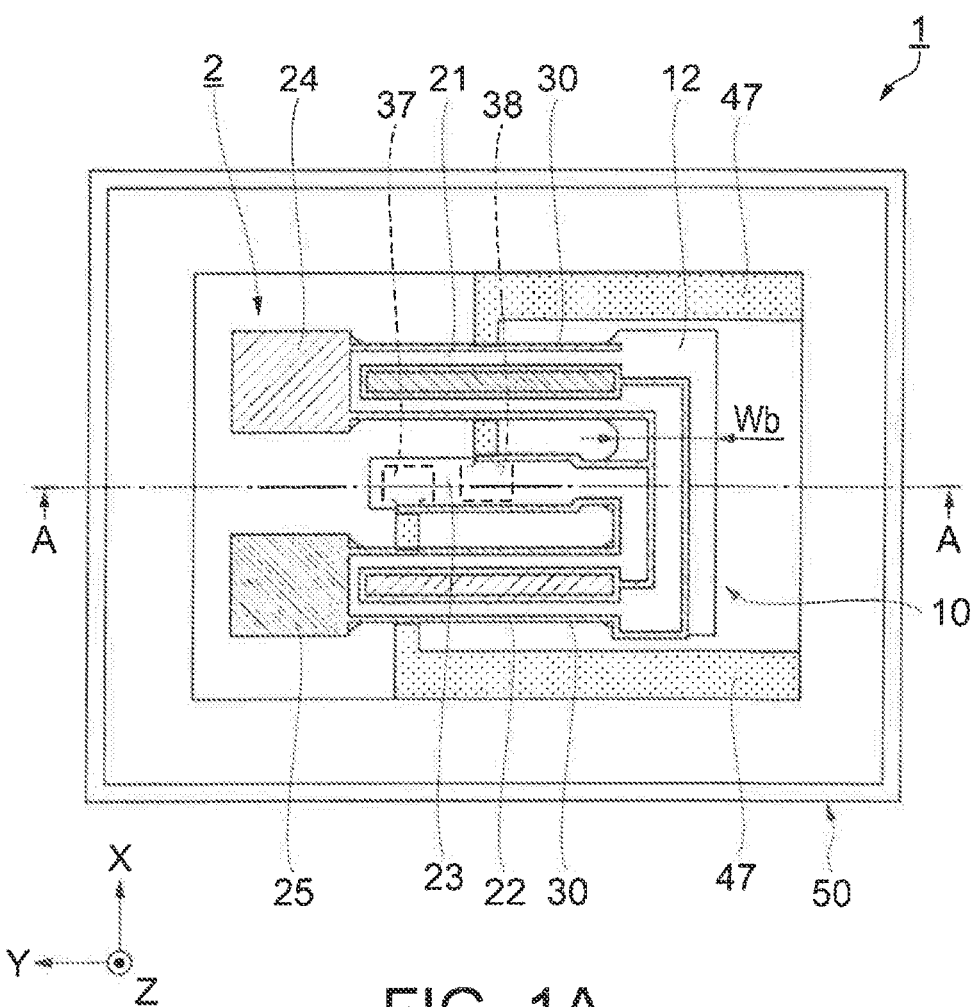
FIG. 1A is a plan view schematically illustrating the structure of a resonator according to an embodiment of the invention.
Figure 1B:
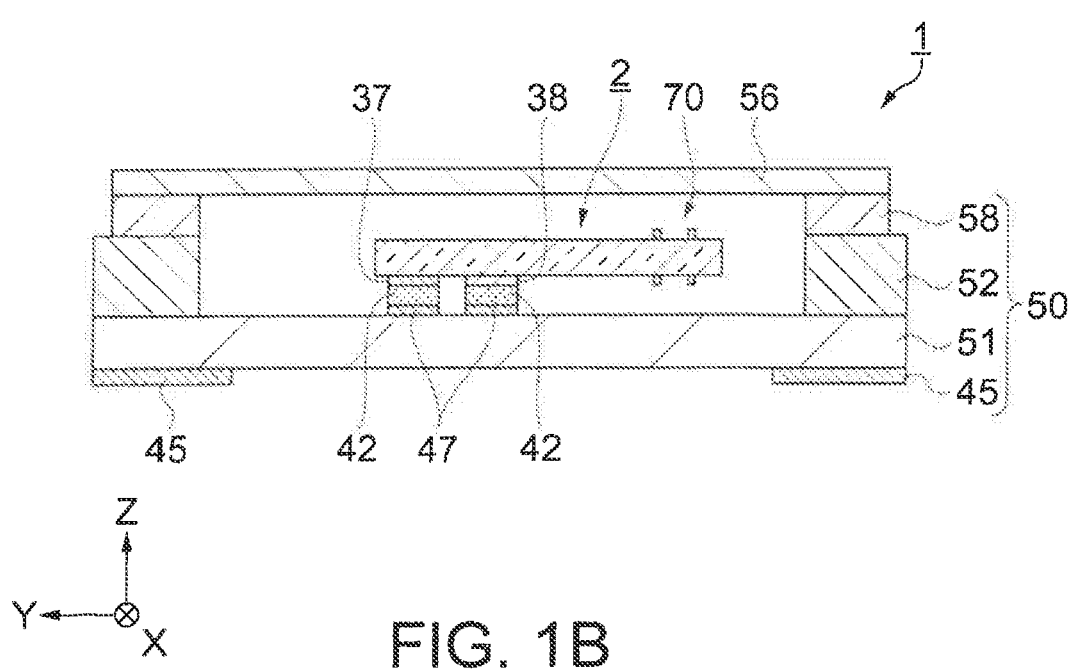
FIG. 1B is a cross-sectional view taken along the line A-A of FIG. 1A.
Figure 2A:
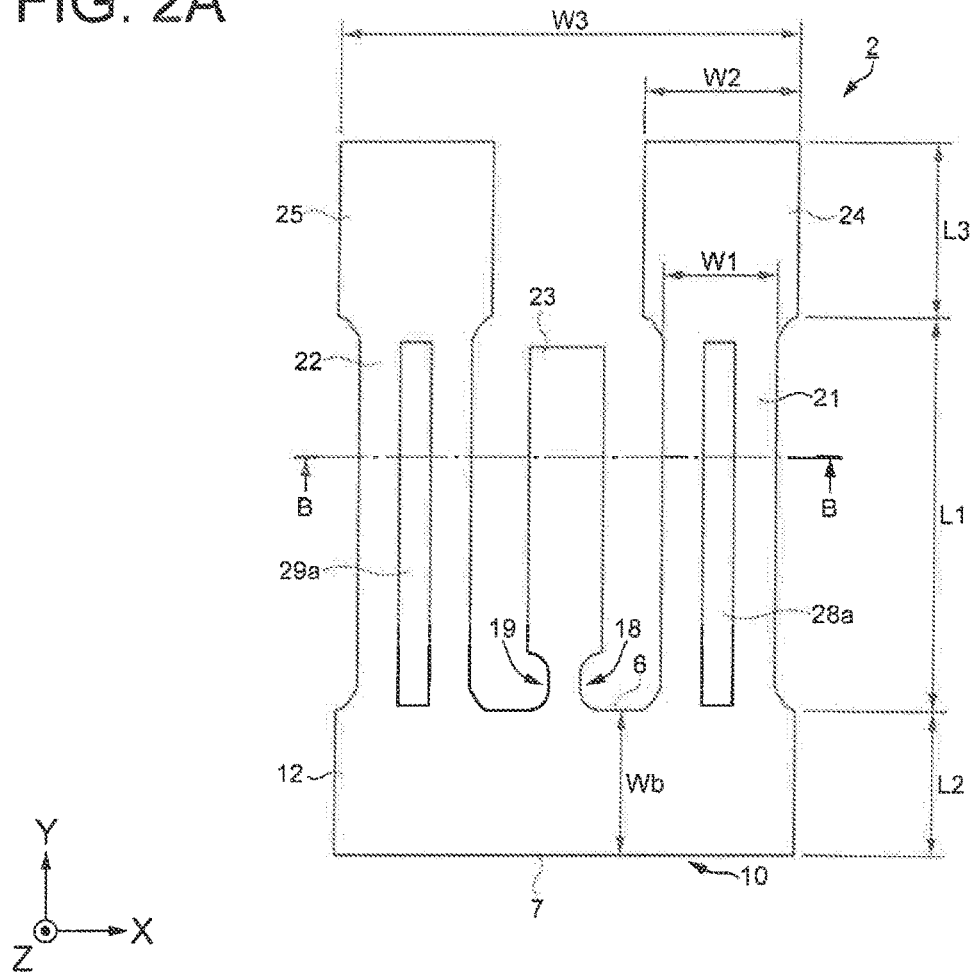
FIG. 2A is a plan view schematically illustrating the structure of a resonator element used in the resonator according to the embodiment of the invention.
Figure 2B:
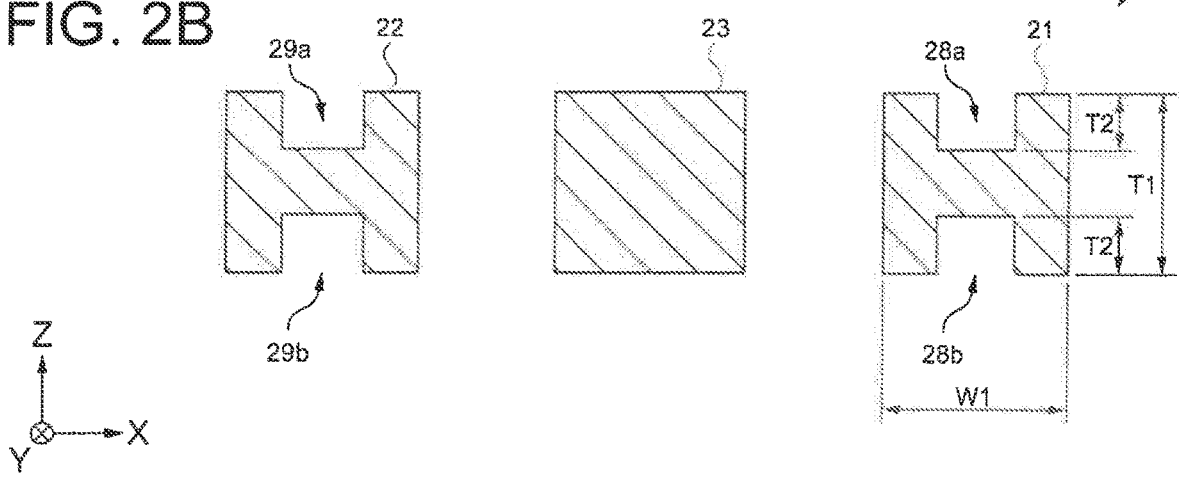
FIG. 2B is a cross-sectional view taken along the line B-B of FIG. 2A.

Hereinafter, embodiments of the invention will be described in detail with reference to the drawings.
Resonator FIG. 1A is a schematic plan view illustrating the structure of a resonator according to an embodiment of the invention and FIG. 1B is a cross-sectional view taken along the line A-A of FIG. 1A. FIG. 2A is a schematic plan view illustrating the structure of a resonator element used in the resonator according to the embodiment of the invention and FIG. 2B is a cross-sectional view taken along the line B-B of FIG. 2A. In FIG. 1A, for convenience of the description of the structure of the resonator 1, a cover member 56 is removed. In each of the drawings, for convenience of description, the X-axis, the Y-axis, and the Z-axis are shown as three axes perpendicular to each other. In addition, for convenience of description, in a plan view as viewed from the Z-axis direction, a surface in the +Z-axis direction is described as an upper surface, a surface in the −Z-axis direction is described as a lower surface.

As shown in FIGS. 1A and 1B, the resonator 1 includes a resonator element 2, a package body 50 which is a rectangular box for accommodating the resonator element 2, and a cover member 56 which is made of, for example, glass, ceramic, or metal.

The resonator element 2 shown in FIGS. 1A and 1B includes a vibration substrate 10 which includes a base portion 12, first and second vibrating arms 21 and 22, weight portions 24 and 25, and a supporting arm 23, a excitation electrode 30 which is provided on the vibration substrate 10, and first and second conductive pads 37 and 38 which are provided on the lower surface of the supporting arm 23.

As shown in FIG. 1B, the package body 50 is formed by laminating a first substrate 51, a second substrate 52, and mounting terminals 45. A plurality of mounting terminals 45 are provided on the outer bottom of the first substrate 51. In addition, a plurality of connection electrodes 47 which are electrically connected to the mounting terminals 45 via through electrodes or interlayer wiring lines (not shown) are provided at predetermined positions of the upper surface of the first substrate 51. The second substrate 52 is a ring-shaped body in which a central portion is removed and a cavity (internal space) 70 for accommodating the resonator element 2 is provided in the second substrate 52. The inside of the cavity 70 is a reduced-pressure space which is almost a vacuum. When the internal space is a vacuum, viscosity resistance is reduced. Therefore, the resonator element 2 can stably vibrate.

In the resonator element 2 which is accommodated in the cavity 70 of the package body 50, the first and second conductive pads 37 and 38 which are provided on the lower surface of the supporting arm 23 and two connection electrodes 47 which are provided on the upper surface of the first substrate 51 of the package body 50 are aligned so as to correspond to each other and are bonded to each other through bonding members 42. The bonding member 42 is a bump, such as a metal bump or a solder bump, or a conductive bonding member, such as a conductive adhesive, and can perform electrical connection and mechanical bonding.

The vibration substrate 10 is made of a crystal material and is, for example, a piezoelectric substrate, such as a quartz crystal substrate, particularly, a Z-cut quartz crystal plate. In this way, the resonator element 2 can have excellent vibration characteristics. The Z-cut quartz crystal plate is a quartz crystal substrate which has the Z-axis (optical axis) of a quartz crystal as a thickness direction. It is preferable that the Z-axis is aligned with the thickness direction of the vibration substrate 10. However, the Z-axis is slightly inclined with respect to the thickness direction (for example, at an angle of less than 15°) in order to reduce a frequency-temperature variation in the vicinity of room temperature.

The vibration substrate 10 is not limited to the quartz crystal substrate. When the resonator element is piezoelectrically driven, the vibration substrate 10 is made of, for example, lithium niobate ($LiNbO_3$), lithium tantalate ($LiTaO_3$), lithium tetraborate ($Li_2B_4O_7$), potassium niobate ($KNbO_3$), gallium phosphate ($GaPO_4$), or langasite crystal ($La_3Ga_5SiO_{14}$).

When the resonator element is electrostatically driven, the vibration substrate 10 is made of, for example, single crystal silicon or polysilicon.

The first substrate 51 and the second substrate 52 of the package body 50 are made of an insulating material. The insulating material is not particularly limited. For example, various kinds of ceramics, such as oxide-based ceramics, nitride-based ceramics, and carbide-based ceramics can be used as the insulating material. In general, electrodes, terminals, wiring patterns for electrically connecting the electrodes and the terminals, or wiring patterns in the layers, which are provided in the package body 50, are formed by screen-printing a metal wiring material, such as tungsten (W) or molybdenum (Mo), to an insulating material, burning the metal wiring material, and plating the metal wiring material with, for example, nickel (Ni) or gold (Au).

The cover member 56 is preferably made of a material which transmits light, for example, borosilicate glass and is bonded to the package body 50 by a sealing member 58 to airtightly seal the cavity 70 of the package body 50. After the package body 50 is covered and sealed, a laser beam is radiated to the vicinity of the leading end of the resonator element 2 from the outside to evaporate a portion of the formed electrode. Therefore, it is possible to adjust the frequency using a mass reduction method. When the frequency is not adjusted, the cover member 56 can be made of a metal material such as kovar alloy.
Resonator Element The structure of the resonator 1 has been described in brief above. Next, the resonator element 2 will be described in detail with reference to FIGS. 2A to 2C.

Figure 2C:
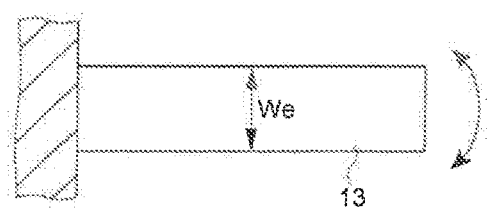
FIG. 2C is a plan view illustrating a virtual beam with a width We in the same direction as the direction of a width Wb of a base portion 12.

As shown in FIGS. 2A to 2C, the vibration substrate 10 of the resonator element 2 includes the base portion 12 including a first end surface 6 and a second end surface 7 that are opposite to each other in the Y-axis direction, which is a first direction, the first and second vibrating arms 21 and 22 that protrude from the base portion 12 in the +Y-axis direction and are arranged in a line in the X-axis direction, which is a second direction, and the supporting arm 23 that is disposed between the first and second vibrating arms 21 and 22 and protrudes from the first end surface 6 of the base portion 12 in the +Y-axis direction.

The first and second vibrating arms 21 and 22 are arranged in a line in the X-axis direction and protrude (project) from the base portion 12 in the +Y-axis direction. In addition, the weight portions 24 and 25 are provided at the leading ends of the first and second vibrating arms 21 and 22, respectively. The provision of the weight portions 24 and 25 makes it possible to reduce the size of the resonator element 2 or to reduce the frequency of the bending vibration of the first and second vibrating arms 21 and 22. The weight portions 24 and 25 may have a plurality of widths, if necessary, or they may be omitted.

Grooves 28a and 28b having a bottom and grooves 29a and 29b having a bottom are provided in the front and rear main surfaces of the first and second vibrating arms 21 and 22, respectively. The grooves 28a, 28b, 29a, and 29b are provided so as to extend in the Y-axis direction and have the same shape. Therefore, the first and second vibrating arms 21 and 22 have a substantial "H" shape in a cross-sectional view, as shown in FIG. 2B.

When the grooves 28a, 28b, 29a, and 29b are formed, heat generated by bending vibration is less likely to be dissipated (transmitted) and it is possible to suppress the occurrence of thermoelastic loss in an adiabatic region in which a bending vibration frequency (mechanical bending vibration frequency) f is higher than a thermal relaxation frequency $f_0$ (f>$f_0$). The grooves 28a, 28b, 29a, and 29b may be provided, if necessary, or they may be omitted.

The supporting arm 23 protrudes from the base portion 12 in the +Y-axis direction and is disposed between the first and second vibrating arms 21 and 22. The supporting arm 23 has a strip shape and has a substantially uniform width in the longitudinal direction (length in the X-axis direction). The first and second conductive pads 37 and 38 for electrical connection to the connection electrodes 47 provided in the package body 50 are provided on the lower surface of the supporting arm 23. Constricted portions 18 and 19 for reducing the transmission of vibration from the base portion 12 to the supporting arm 23 are provided between the supporting arm 23 and the base portion 12.

Miniaturization

Next, a reduction in the size of the resonator element 2 (resonator 1), which is an object of the invention, will be described in detail.

Figure 3:
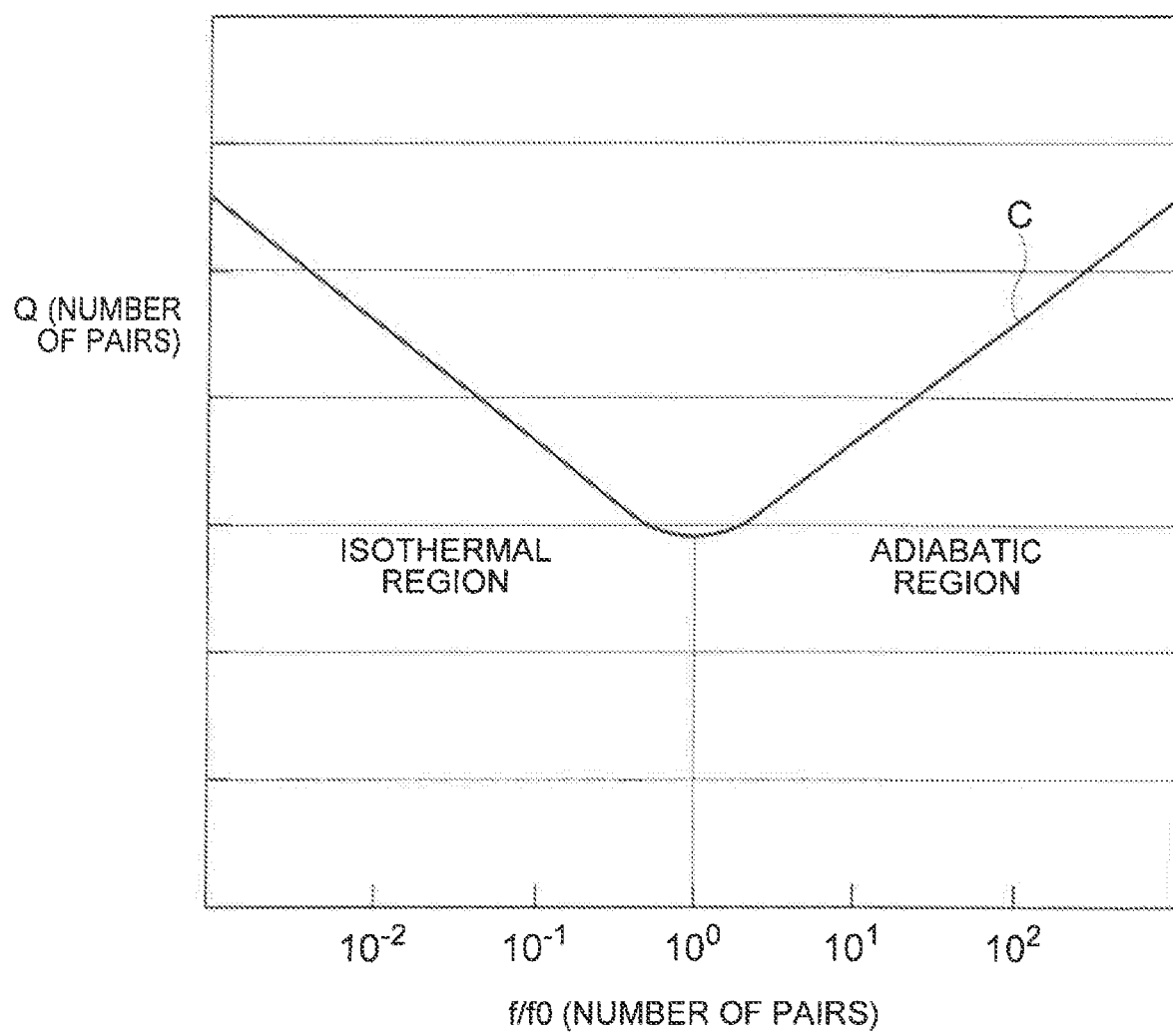
FIG. 3 is a schematic diagram illustrating an isothermal region and an adiabatic region of the resonator.

FIG. 3 is a schematic diagram illustrating the isothermal region and the adiabatic region of the resonator.

In the resonator 1 which has the Z-cut quartz crystal plate as the vibration substrate 10, when a driving signal is applied from the outside through the mounting terminal 45, the connection electrode 47, the bonding member 42, the first and second conductive pads 37 and 38, and the electrode 30, the resonator element 2 oscillates (resonates) at a predetermined frequency (for example, 32.768 kHz).

The resonator element 2 is set such that the mechanical vibration frequency f is higher than the thermal relaxation frequency $f_0$ (f>$f_0$). Therefore, the resonator element 2 bends and vibrates in the adiabatic region.

Here, the adiabatic region will be described in brief. FIG. 3 is a schematic diagram illustrating the adiabatic region.

In general, in the resonator element in a bending vibration mode, the thermoelastic loss of the resonator which bends and vibrates (the loss of vibration energy caused by thermal conduction between an increase in the temperature of a compressed portion and a reduction in the temperature of an expanded portion in the resonator element which bends and vibrates) is at the maximum when the vibration frequency f is equal to a relaxation frequency $f_m = 1/(2 \times \pi \times \tau)$ (in the expression, $\pi$ is the ratio of the circumference of a circle to its diameter and $\tau$ is a relaxation time required for a temperature difference to increase by $e^{-1}$ times (e is a Napier's constant) by thermal conduction).

In general, it has been known that the relaxation frequency $f_0$ when the vibrating arm has a flat plate structure is calculated by the following Expression (1).

$$f_0 = (\pi \times k)/(2 \times \rho \times C_p \times a^2) \qquad (1)$$

(where $\pi$ is the ratio of the circumference of a circle to its diameter, k is thermal conductivity [W/(m×K)] in the vibration direction (bending vibration direction) of the vibrating arm, $\rho$ is the mass density [kg/m$^3$] of the vibrating arm, $C_p$ is the heat capacity per unit mass at constant pressure [J/(kg×K)] of the vibrating arm, and a is the width [m] of the vibrating arm in the vibration direction (bending vibration direction))

The relationship between the Q-value and the frequency is generally represented by a line C shown in FIG. 3. In FIG. 3, the frequency at which the Q-value is the minimum is the thermal relaxation frequency $f_0$.

When the vibrating arm has the flat plate structure, a region in which the vibration frequency f is higher than the thermal relaxation frequency $f_0$ and the frequency ratio is greater than 1 (1<f/$f_0$) is the adiabatic region and a region in which the frequency ratio is less than 1 (1>f/$f_0$) is the isothermal region. That is, f/$f_0$=1 is the boundary between the regions.

In a structure in which the groove is formed in at least one of the front and rear main surfaces (two main surfaces which are opposite to each other in a direction perpendicular to the direction in which bending vibration occurs) of the vibrating arm, when a thermal relaxation frequency is $f_1$, a region in which the vibration frequency f is higher than the thermal relaxation frequency $f_1$ and the frequency ratio is greater than 1 (1<f/$f_1$) is the adiabatic region and a region in which the frequency ratio is less than 1 (1>f/$f_1$) is the isothermal region. That is, f/$f_1$=1 is the boundary between the regions.

In addition, in the structure in which the groove is formed in at least one of the front and rear main surfaces of the vibrating arm, the path of heat which is generated between an increase in the temperature of the compressed portion and a reduction in the temperature of the expanded portion in the resonator element that bends and vibrates is longer than that in the flat plate structure and the relaxation time also increases. That is, the thermal relaxation frequency $f_1$ is lower than the thermal relaxation frequency $f_0$ in the flat plate structure ($f_1 < f_0$). Therefore, $f_1 < (f_0 \times f_1)^{1/2} < f_0$ is satisfied. When the vibrating arm has the flat plate structure, it is preferable that 1<f/$f_0$ (adiabatic region) is satisfied. In the structure in which the groove is formed in at least one of the front and rear main surfaces of the vibrating arm, it is preferable that 1<f/$f_1$ (adiabatic region) is satisfied. It is more preferable that f>$(f_0 \times f_1)^{1/2}$ is satisfied. It is most preferable that 1<f/$f_0$ is satisfied.

When this relationship is satisfied, the thermoelastic loss of the first and second vibrating arms 21 and 22 of the resonator element 2 is reduced.

In the structure in which the groove is formed in at least one of the front and rear main surfaces of the vibrating arm, when the relationship between $f_0$ which is calculated from the width of the vibrating arm (the length of the vibrating arm in the direction in which bending vibration occurs) by Expression (1) and the vibration frequency f satisfies f>f$_0$, 1<f/f$_1$ is automatically satisfied.

When the first and second vibrating arms 21 and 22 perform bending vibration in which separation and approach are alternately repeated in the base portion 12, a bending vibration body in which the length of a beam is the length of the base portion 12 in the X-axis direction and the width of the beam is the length of the base portion 12 in the Y-axis direction (a length in the bending vibration direction) performs bending vibration and is displaced in the Y-axis direction, as shown in FIG. 2C. Therefore, the first end surface 6 and the second end surface 7 of the base portion 12 are repeatedly compressed and expanded and thermoelastic loss occurs, which causes the deterioration of the Q-value of the resonator 1 including the resonator element 2.

In the embodiment of the invention, attention is paid to the relationship between the dimensions of the base portion 12 of the resonator element 2 and thermoelastic loss, and thermoelastic loss which is caused by the bending vibration of the base portion 12 due to the bending vibration of the first and second vibrating arms 21 and 22 is compared with thermoelastic loss calculated by converting the Q-value of the resonator 1 into the bending vibration of the base portion 12.

In the base portion 12, a portion with the minimum width (the minimum length in the Y-axis direction) has the lowest rigidity and the amount of bending of the portion is the largest. Therefore, in the portion, the deterioration of the Q-value due to thermoelastic loss, which is caused by the dissipation of heat generated by the alternate compression and expansion of both ends of the portion in the width direction, is the largest. As shown in FIG. 2C, a virtual beam 13 with a width in the same direction as the direction of the width Wb of the portion with the minimum width in the base portion 12 is assumed and the width of the virtual beam which is set such that the Q-value obtained by the bending vibration of the virtual beam is equal to the Q-value of the entire resonator 1 is defined as We. A relational expression between the defined width and the thermal relaxation frequency f$_{0e}$ of the bending vibration of the virtual beam is established. The ratio (Wb/We) of the width Wb to the width We (hereinafter, referred to as an effective width) of the virtual beam is optimized. In this way, the deterioration of the Q-value with a reduction in the size of the resonator element 2 is reduced.

The following Expression (2) indicates the Q-value of the entire resonator 1 and the following Expression (3) indicates the thermal relaxation frequency f$_{0e}$ at which the Q-value is the minimum by the above-mentioned Expression (1).

$$Q = \{(\rho \times C_p)/(c \times \alpha^2 \times \Theta)\} \times [\{1+(f/f_{0e})^2\}/(f/f_{0e})] \quad (2)$$

$$f_{0e} = (\pi \times k)/(2 \times \rho \times C_p \times We^2) \quad (3)$$

(where We is an effective width (the width of the virtual beam) [m], f is the actual vibration frequency [Hz] obtained from the resonator (in a state in which the resonator element is mounted in the package), f$_0$ is the effective thermal relaxation frequency [Hz] of the resonator (the thermal relaxation frequency of the virtual beam), and Q is the actual Q-value obtained from the resonator)

The following Expression (4) is calculated from Expressions (2) and (3).

$$Q=\{(\rho \times C_p)/(c \times \alpha^2 \times \Theta)\} \times [\{1+(2 \times \rho \times C_p \times We^2 \times f/(\pi \times k))^2\}/(2 \times \rho \times C_p \times We^2 \times f/(\pi \times k))] \quad (4)$$

As can be seen from Expression (4), the Q-value is the relational expression of We.

The following constants are uniquely determined when a material is determined (from the relationship with the crystal axis when the cut angle of a quartz crystal is determined): ρ is mass density [kg/m$^3$]; C$_p$ is heat capacity per unit mass at constant pressure [J/(kg×K)]; c is an elastic constant [N/m$^2$] related to a direction perpendicular to the direction of Wb in the plane; α is a thermal expansion coefficient [1/K] related to the direction perpendicular to the direction of Wb in the plane; Θ is an environmental temperature [K]; and k is thermal conductivity [W/(m×K)] related to the direction of Wb.

Therefore, since only the effective width We is not known in Expressions (2) and (3), it is calculated from the Expression (4).

Next, the correlation between We and the Q-value of the resonator 1 which was experimentally produced while changing the width Wb of the base portion 12 of the resonator element 2 was investigated by numerical analysis using a finite element method and the optimization of Wb/We was examined.

Figures 4, 5:
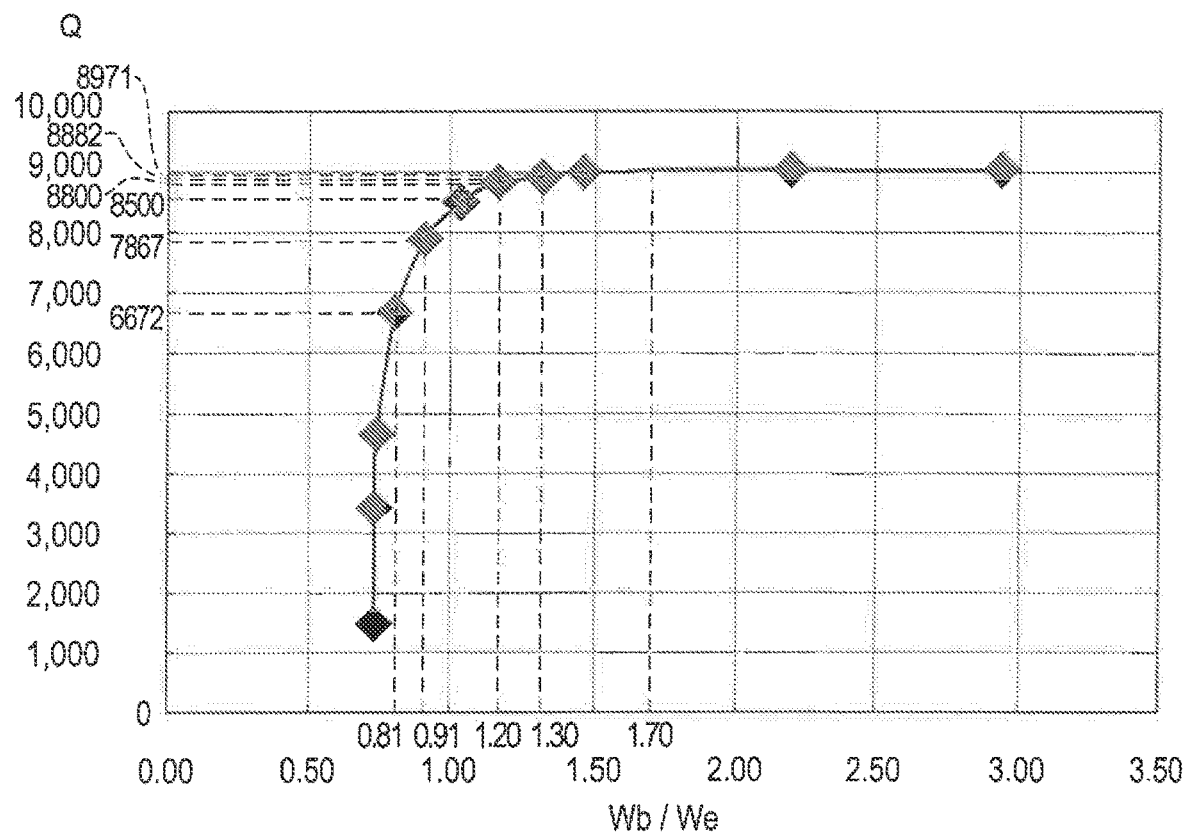
FIG. 4 is a diagram illustrating the experimental production conditions and characteristic result of the resonator.
FIG. 5 is a diagram illustrating a Q-value with respect to Wb/We in the experimentally produced resonator.

FIG. 4 is a diagram illustrating the numerical analysis conditions and characteristic result of the resonator. FIG. 5 is a diagram illustrating the Q-value with respect to Wb/We in the resonator which is numerically analyzed.

Dimensions other than Wb in the numerical analysis conditions of the resonator are as follows.

L1=573 [μm]
L2=Wb
L3=137 [μm]
W1=40 [μm]
W2=255 [μm]
W3=550 [μm]
T1=130 [μm]
T2=60 [μm]

Each parameter in Expression (2) and Expression (3) is as follows.

ρ=2649 [kg/m$^3$]
C$_P$=735.3718 [J/(kg×K)]
α=α$_{11}$=α$_{22}$=1.37×10$^{-5}$ [1/K]
c=c$_{11}$=c$_{22}$=8.67×10$^{10}$ [N/m$^2$]
Θ=298.15 [K]
k=8.47 [W/(m×K)]

Since the vibration substrate 10 is a Z-cut quartz crystal plate (cut angle: 0 degree), α=α$_{11}$=α$_{22}$ and c=c$_{11}$=c$_{22}$ are established.

It was analyzed that the grooves 28a, 28b, 29a, and 29b of the vibrating arms 21 and 22 had a shape of which anisotropy is taken into consideration during wet etching.

As can be seen from FIGS. 4 and 5, when the width Wb of the base portion 12 is changed from 25 μm to 200 μm, the Q-value is largely changed from 1,484 to 9,018. When the value of Wb/We is equal to or greater than about 1, the Q-value is equal to or greater than about 8,500. When the value of Wb/We is equal to or greater than about 1.3, the Q-value is substantially constant at about 9,000.

From these results, it is possible to obtain the resonator element 2 in which the value of Wb/We is equal to or greater than 0.81 and equal to or less than 1.70, Wb is in the range of 50 μm to 116 μm, the Q-value is in the range of 6,672 to 8,971, and the overall length is in the range of 760 μm to 826 μm, as compared to the resonator 1 including the resonator element 2 according to the related art in which Wb (=L2) is 200 μm and the overall length (L1+L2+L3) is 910 μm. According to this structure, a small resonator 1 is obtained in which the Q-value of the resonator element which enables an oscillation circuit to stably oscillate is obtained and is preferably equal to or greater than 6,600 and the overall length is 9.2% to 16.5% of the overall length of the resonator according to the related art.

In addition, it is possible to obtain the resonator element 2 in which the value of Wb/We is equal to or greater than 0.91 and equal to or less than 1.30, Wb is in the range of 60 μm to 89 μm, the Q-value is in the range of 7,867 to 8,882, and the overall length is in the range of 770 μm to 799 μm. According to this structure, a small resonator 1 is obtained in which the Q-value is equal to or greater than 7,800 at which the oscillation circuit can stably oscillate and the overall length is 12.2% to 15.4% of the overall length of the resonator according to the related art.

Furthermore, it is possible to obtain the resonator element 2 in which the value of Wb/We is equal to or greater than 1.00 and equal to or less than 1.20, Wb is in the range of about 70 μm to 80 μm, the Q-value is in the range of about 8,500 to 8,800, and the overall length is in the range of about 780 μm to 790 μm. According to this structure, a small resonator 1 is obtained in which the Q-value is equal to or greater than 8,500 at which the oscillation circuit can stably oscillate and the overall length is about 13.2% to 14.3% of the overall length of the resonator according to the related art.

It is preferable that the value of Wb/We is in the above-mentioned range in the adiabatic region in which the vibration frequency f of the resonator 1 is higher than a thermal relaxation frequency $f_{0b}$ when the base portion 12 is regarded as a bending vibration body.

Here, $f_{0b}$ is the thermal relaxation frequency obtained by substituting Wb into Expression (1), instead of a, and can be represented by the following Expression (5).

$$f_{0b} = (\pi \times k)/(2 \times \rho \times C_p \times Wb^2) \quad (5)$$

In the isothermal region in which the vibration frequency f of the resonator 1 is lower than the thermal relaxation frequency $f_{0b}$, as can be seen from the replacement of $f_0$ with $f_{0b}$ in FIG. 3, when the vibration frequency f is considered as a fixed value, thermoelastic loss is reduced as the thermal relaxation frequency $f_{0b}$ increases. As a result, the Q-value increases. That is, as the thermal relaxation time which is the reciprocal of the thermal relaxation frequency $f_{0b}$ is reduced, that is, as the heat transfer path Wb is narrowed, thermoelastic loss is reduced and the Q-value increases. Therefore, it is preferable that the value of Wb/We is equal to or less than 1.00.

Electrode Structure

A reduction in the size of the resonator element 2 (resonator 1) has been described above. Next, the electrode 30 provided on the vibration substrate 10 of the resonator element 2 will be described.

Figures 6A, 6B:
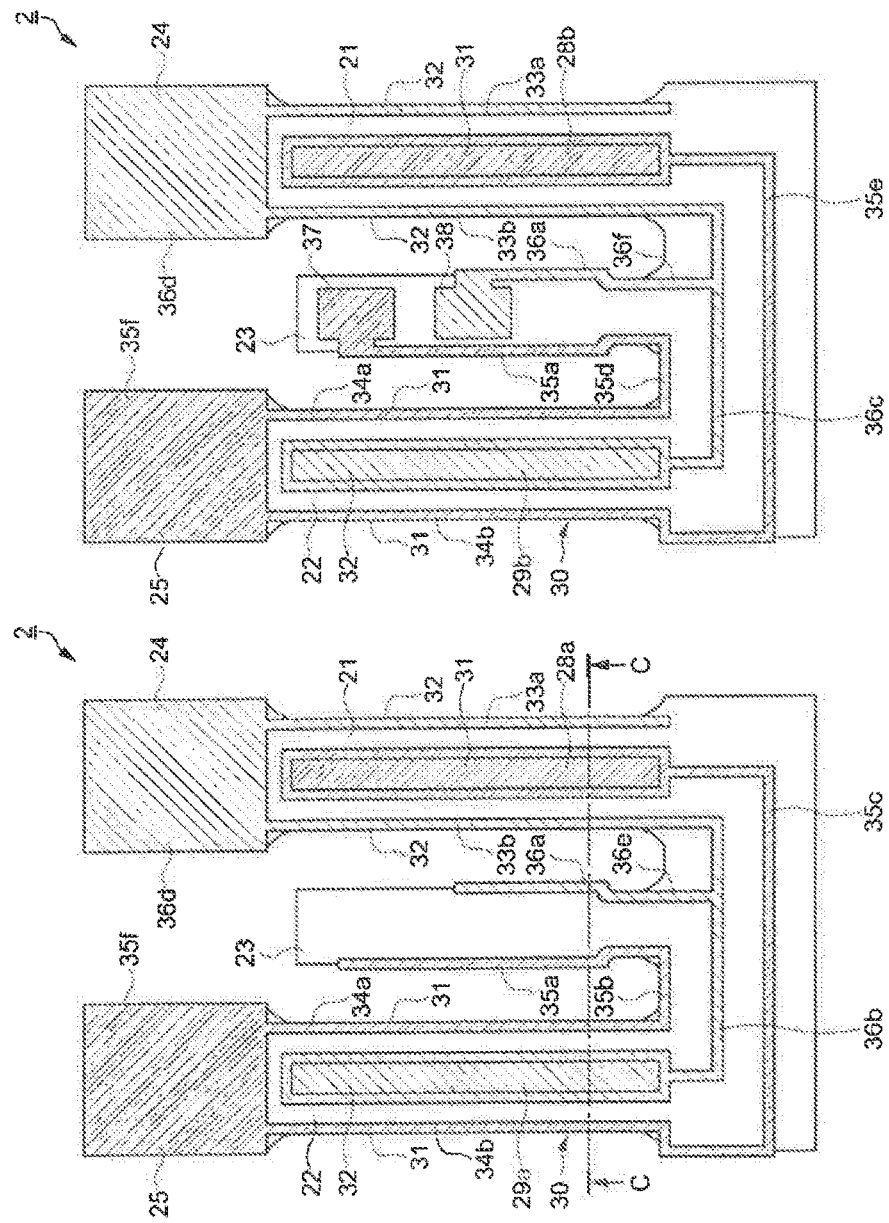
FIG. 6A is a top view illustrating the electrode structure of the resonator element used in the resonator according to the embodiment of the invention.
FIG. 6B is a bottom view (perspective view) illustrating the electrode structure.
Figure 7:
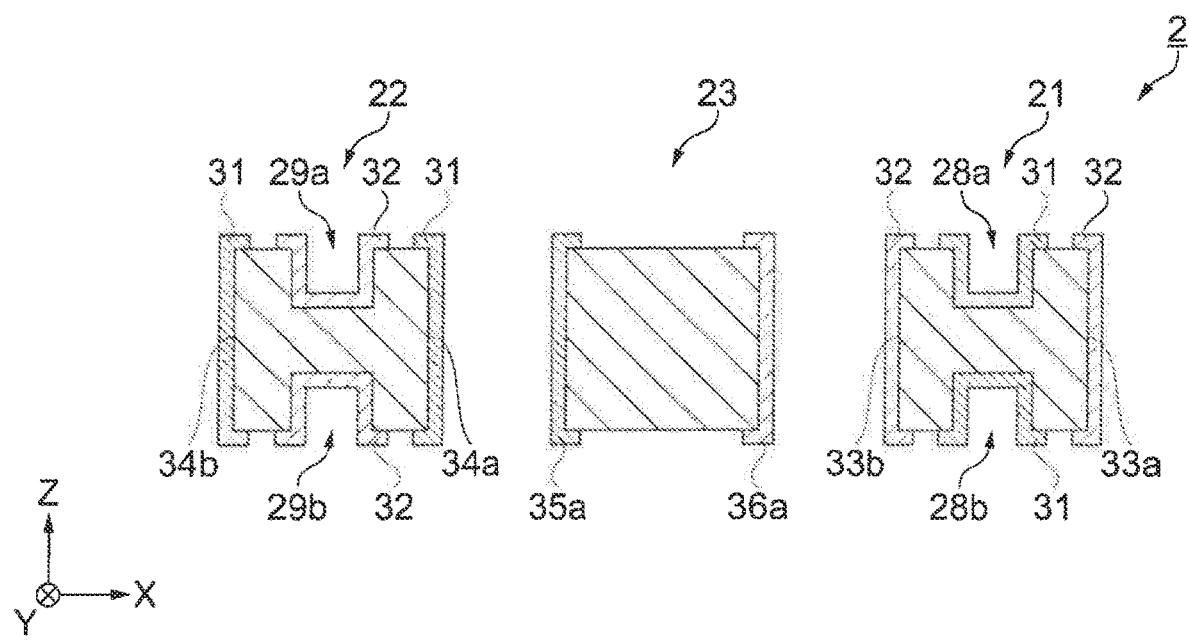
FIG. 7 is a cross-sectional view taken along the line C-C of FIG. 6A.

FIGS. 6A and 6B are plan views illustrating the electrode structure of the resonator element used in the resonator according to the embodiment of the invention. FIG. 6A is a top view and FIG. 6B is a bottom view (perspective view) of FIG. 6A. FIG. 7 is a cross-sectional view taken along the line C-C of FIG. 6A.

As shown in FIGS. 6A and 6B and FIG. 7, the electrode 30 includes a plurality of first excitation electrodes 31, the first conductive pad 37, wiring lines 35a, 35b, 35c, 35d, 35e, and 35f which connect the plurality of first excitation electrodes 31 and the first conductive pad 37, a plurality of second excitation electrodes 32, the second conductive pad 38, and wiring lines 36a, 36b, 36c, 36d, 36e, and 36f which connect the plurality of second excitation electrodes 32 and the second conductive pad 38.

The first excitation electrode 31 is provided on the inner surfaces of the grooves 28a and 28b of the first vibrating arm 21 and the side surfaces 34a and 34b of the second vibrating arm 22. The first excitation electrode 31 in the groove 28a is connected to the first excitation electrode 31 on the side surface 34b through the wiring line 35c which is provided on the upper and side surfaces of the base portion 12. The first excitation electrode 31 in the groove 28b is connected to the first excitation electrode 31 on the side surface 34b through the wiring line 35e which is provided on the lower and side surfaces of the base portion 12. The wiring lines 35c and 35e are connected to each other on the side surface of the base portion 12.

Then, the first excitation electrode 31 on the side surface 34b is connected to the first excitation electrode 31 on the side surface 34a through the wiring line 35f provided in the weight portion 25. The first excitation electrode 31 on the side surface 34a is connected to the wiring line 35a provided on the upper and lower surfaces or the side surface of the supporting arm 23 through the wiring line 35b and the wiring line 35d which are respectively provided on the upper and lower surfaces of the base portion 12. The wiring line 35a is electrically connected to the first conductive pad 37 provided on the lower surface of the supporting arm 23.

The second excitation electrode 32 is provided on the inner surfaces of the grooves 29a and 29b of the second vibrating arm 22 and the side surfaces 33a and 33b of the first vibrating arm 21. The second excitation electrode 32 in the groove 29a is connected to the second excitation electrode 32 on the side surface 33b through the wiring line 36b provided on the upper surface of the base portion 12. The second excitation electrode 32 in the groove 29b is connected to the second excitation electrode 32 on the side surface 33b through the wiring line 36c provided on the lower surface of the base portion 12.

Then, the second excitation electrode 32 provided on the side surface 33b is connected to the second excitation electrode 32 provided on the side surface 33a through the wiring line 36d provided in the weight portion 24. The wiring line 36b on the upper surface of the base portion 12 and the wiring line 36c on the lower surface of the base portion 12 are connected to the wiring line 36a provided on the upper and lower surfaces or the side surface of the supporting arm 23 through the wiring line 36e provided on the upper surface of the base portion 12 and the wiring line 36f provided on the lower surface of the base portion 12, respectively. The wiring line 36a is electrically connected to the second conductive pad 38 provided on the lower surface of the supporting arm 23.

When a driving voltage is applied from the first and second conductive pads 37 and 38 to the first and second excitation electrodes 31 and 32 through each wiring line, an appropriate electric field is generated in the vibrating arms of the resonator element 2 and the first and second vibrating arms 21 and 22 vibrate substantially in the in-plane direction (XY-plane direction) at a predetermined frequency so as to repeat approach and separation.

The material forming the electrode 30 is not particularly limited. However, the electrode 30 can be made of a metal material, such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr), and a conductive material, such as an indium tin oxide (ITO).

Manufacturing Method

The electrode structure of the resonator element 2 has been described above. The resonator element 2 can be manufactured as follows. The following manufacturing method is an illustrative example and the resonator element 2 may be manufactured by other manufacturing methods.

FIGS. 8A to 8D are cross-sectional views illustrating the supporting arm 23 and the first and second vibrating arms 21 and 22 having the grooves 28a, 28b, 29a, and 29b provided therein for describing a method for manufacturing the resonator element 2 used in the resonator 1 according to the embodiment of the invention.

Figure 8A:
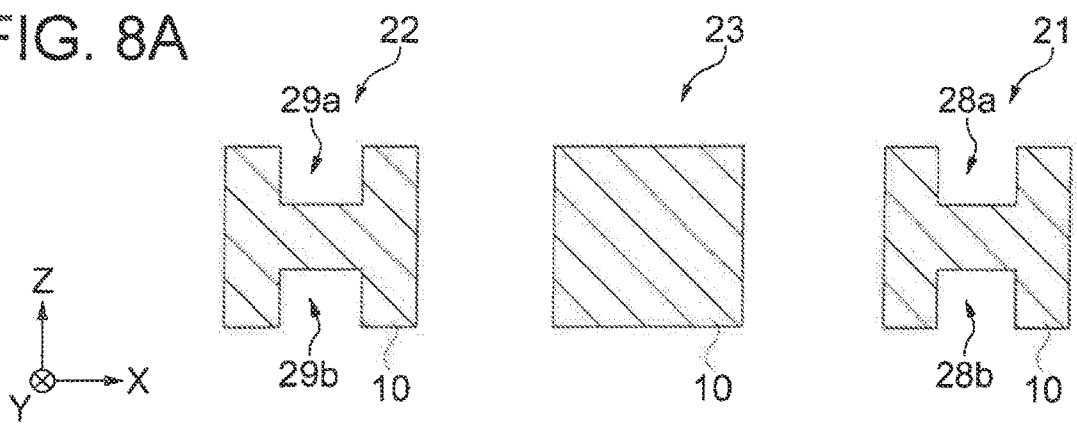
FIGS. 8A to 8D are cross-sectional views illustrating vibrating arms and a supporting arm in a method for manufacturing the resonator element used in the resonator according to the embodiment of the invention.

First, as shown in FIG. 8A, the vibration substrate 10 is prepared. The vibration substrate 10 can be manufactured by forming a pattern corresponding to the outward shape of the resonator element in a Z-cut quartz crystal substrate and performing wet etching.

Figure 8B:
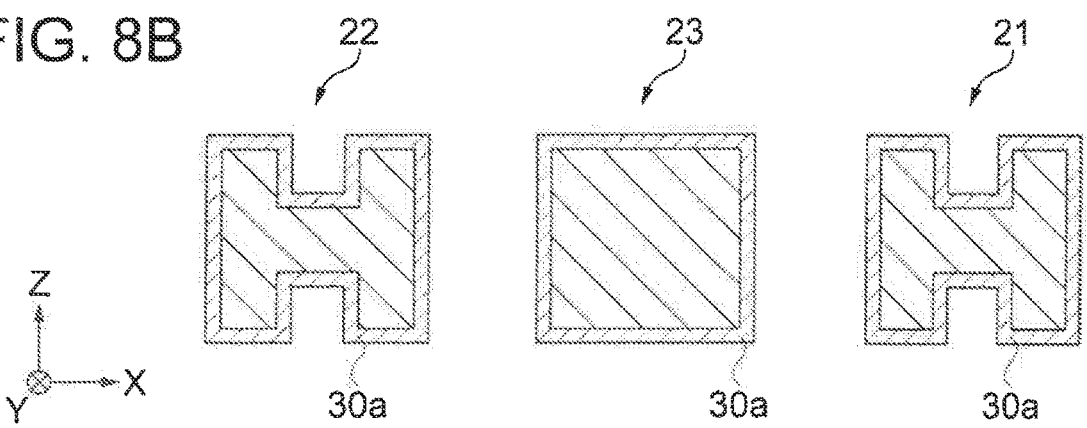

Then, as shown in FIG. 8B, an electrode film 30a is formed on the entire surface of the vibration substrate 10 by, for example, vapor deposition or sputtering.

Figure 8C:
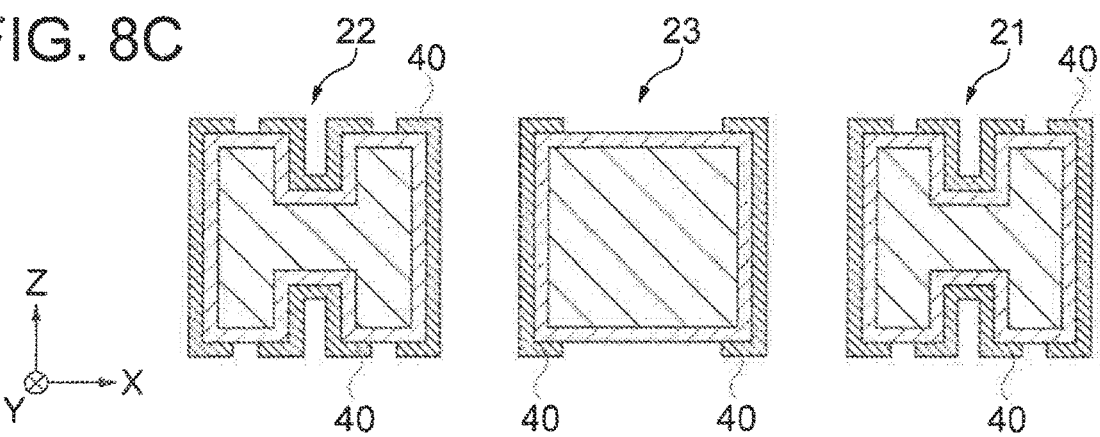

Then, as shown in FIG. 8C, a resist film 40 (positive photoresist film) is coated on the electrode film 30a and exposure and development are performed to pattern the resist film 40, thereby forming a resist pattern corresponding to the shape of the electrode 30.

Figure 8D:
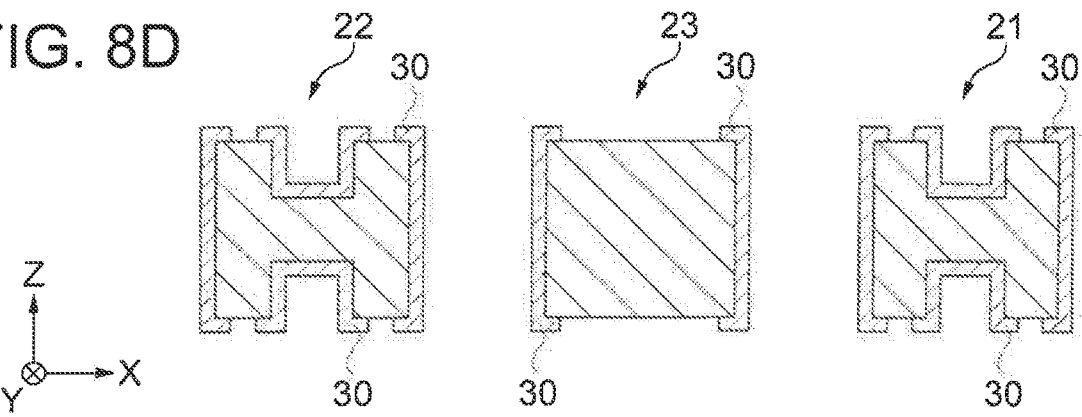

Then, a portion of the electrode film 30a which is exposed from the resist pattern is removed by wet etching and the resist pattern is removed. In this way, the electrode 30 is formed. As shown in FIG. 8D, the resonator element 2 having the electrode 30 formed thereon is obtained by the above-mentioned process.

Modification Examples of Resonator Element

Next, modification examples of the resonator element 2 used in the resonator 1 according to the embodiment of the invention will be described.

Figure 9A:
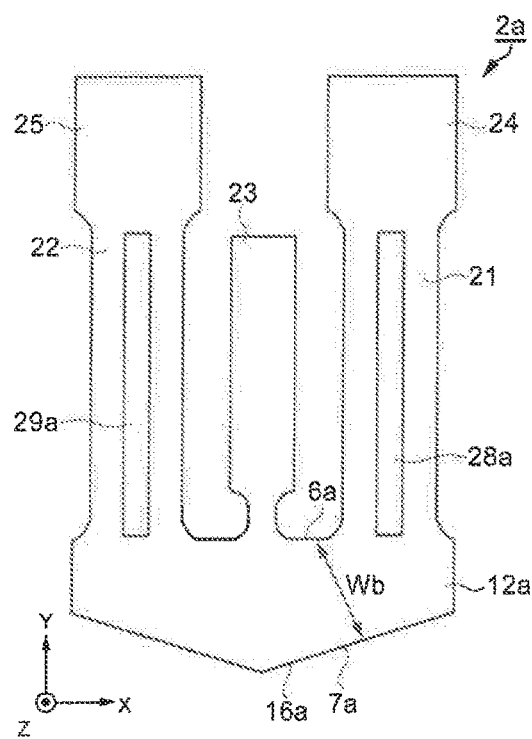
FIG. 9A is a plan view illustrating Modification Example 1 of the resonator element used in the resonator according to the embodiment of the invention.
Figure 9B:
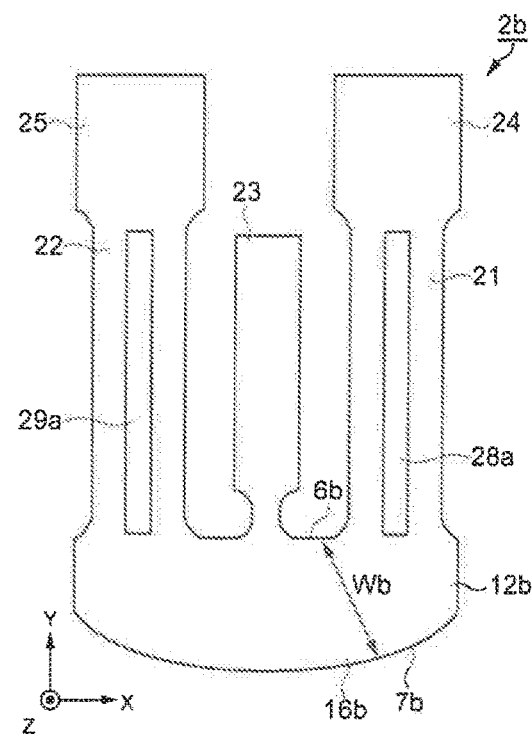
FIG. 9B is a plan view illustrating Modification Example 2 of the resonator element used in the resonator according to the embodiment of the invention.
Figure 9C:
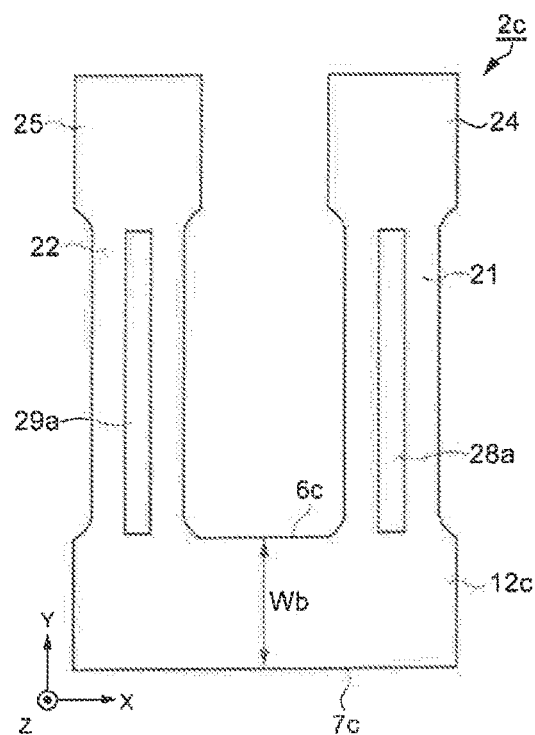
FIG. 9C is a plan view illustrating Modification Example 3 of the resonator element used in the resonator according to the embodiment of the invention.
Figure 9D:
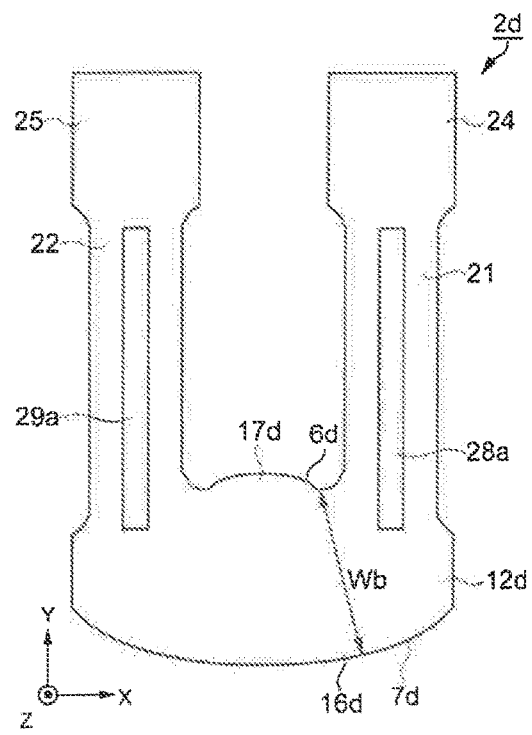
FIG. 9D is a plan view illustrating Modification Example 4 of the resonator element used in the resonator according to the embodiment of the invention.

FIGS. 9A to 9D are plan views illustrating the modification examples of the resonator element used in the resonator according to the embodiment of the invention. FIG. 9A shows Modification Example 1, FIG. 9B shows Modification Example 2, FIG. 9C shows Modification Example 3, and FIG. 9D shows Modification Example 4.

FIGS. 10A to 10D are plan views illustrating the modification examples of the resonator element used in the resonator 1 according to the embodiment of the invention. FIG. 10A shows Modification Example 5, FIG. 10B shows Modification Example 6, FIG. 10C shows Modification Example 7, and FIG. 10D shows Modification Example 8.

Hereinafter, in the modification examples, the difference from the above-mentioned embodiment will be mainly described. The same structures are denoted by the same reference signs and the description thereof will not be repeated.

In a resonator element 2a according to Modification Example 1 shown in FIG. 9A, a reduced width portion 16a whose width is gradually reduced in the −Y-axis direction is provided in a second end surface 7a of a base portion 12a. The provision of the reduced width portion 16a makes it possible to suppress vibration leakage due to the bending vibration of the first and second vibrating arms 21 and 22 and to obtain the resonator element 2a with a high Q-value.

In a resonator element 2b according to Modification Example 2 shown in FIG. 9B, similarly to Modification Example 1, an arc-shaped reduced width portion 16b whose width is gradually reduced in the −Y-axis direction is provided in a second end surface 7b of a base portion 12b. Therefore, it is possible to suppress vibration leakage due to the bending vibration of the first and second vibrating arms 21 and 22 and thus to obtain the resonator element 2b with a high Q-value.

A resonator element 2c according to Modification Example 3 shown in FIG. 9C has a structure in which a base portion 12c is supported and no supporting arm is provided between the first and second vibrating arms 21 and 22. Therefore, it is possible to reduce the width of the resonator element 2c (X-axis direction) and thus to obtain the resonator element 2c with a small width.

Similarly to Modification Example 3, a resonator element 2d according to Modification Example 4 shown in FIG. 9D has a structure in which no supporting arm is provided between the first and second vibrating arms 21 and 22. Therefore, it is possible to reduce the width of the resonator element 2d (X-axis direction). In addition, in the resonator element 2d, an arc-shaped reduced width portion 17d whose width is gradually reduced in the +Y-axis direction is provided in a first end surface 6d of a base portion 12d and an arc-shaped reduced width portion 16d whose width is gradually reduced in the −Y-axis direction is provided in a second end surface 7d of the base portion 12d. Therefore, it is possible to further suppress vibration leakage due to the bending vibration of the first and second vibrating arms 21 and 22 and to obtain a high Q-value. As a result, it is possible to obtain the resonator element 2d with a small size and a high Q-value.

In a resonator element 2e according to Modification Example 5 shown in FIG. 10A, an arc-shaped reduced width portion 17e whose width is gradually reduced in the +Y-axis direction and a supporting arm 23e which is provided between the first and second vibrating arms 21 and 22 are provided in a first end surface 6e of the base portion 12e and an arc-shaped reduced width portion 16e whose width is gradually reduced in the −Y-axis direction is provided in a second end surface 7e of the base portion 12e. In addition, a supporting portion 26e is provided at the leading end of the supporting arm 23e. Since the arc-shaped reduced width portions 16e and 17e are provided in the base portion 12e and it is possible to support and fix the supporting portion 26e which is disposed at the position separated from the base portion 12e, it is possible to further suppress vibration leakage due to the bending vibration of the first and second vibrating arms 21 and 22 and thus to obtain the resonator element 2e with a high Q-value.

In a resonator element 2f according to Modification Example 6 shown in FIG. 10B, a supporting portion 26f has a frame shape which surrounds the first and second vibrating arms 21 and 22 and a base portion 12f. Therefore, the supporting portion 26f is interposed between a cover and a package base and it is possible to obtain a resonator 1 in which the supporting portion 26f functions as a portion of a package (not shown) and which has the same plane size as the resonator element 2f.

In a resonator element 2g according to Modification Example 7 shown in FIG. 10C, supporting arms 23g are provided at both ends of a base portion 12g in the X-axis direction. Therefore, it is possible to support and fix the two supporting arms 23g and thus obtain the resonator element 2g with high vibration resistance and high drop impact resistance.

In a resonator element 2h according to Modification Example 8 shown in FIG. 10D, similarly to Modification Example 6, a supporting portion 26h has a frame shape which surrounds the first and second vibrating arms 21 and 22 and a base portion 12h. Therefore, the supporting portion 26h is interposed between a cover and a package base and it is possible to obtain a resonator 1 in which the supporting portion 26h functions as a portion of a package (not shown) and which has the same plane size as the resonator element 2h.

The resonator element can be made of materials other than the piezoelectric material. For example, the resonator element can be formed using a silicon semiconductor material. The vibration (driving) system of the resonator element is not limited to the piezoelectric driving. The resonator element may be, for example, an electrostatic driving type using electrostatic force or a Lorentz driving type using magnetic force other than a piezoelectric driving type using a piezoelectric substrate. In this case, it is possible to obtain the same structure and effect of the invention. In the specification and the drawings, the terms described together with broader different terms or synonymous different terms at least once can be replaced with the different terms in any parts of the specification or the drawings.

Electronic Device

Next, an electronic device 3 to which the resonator 1 according to the invention is applied will be described.

Figure 11A:
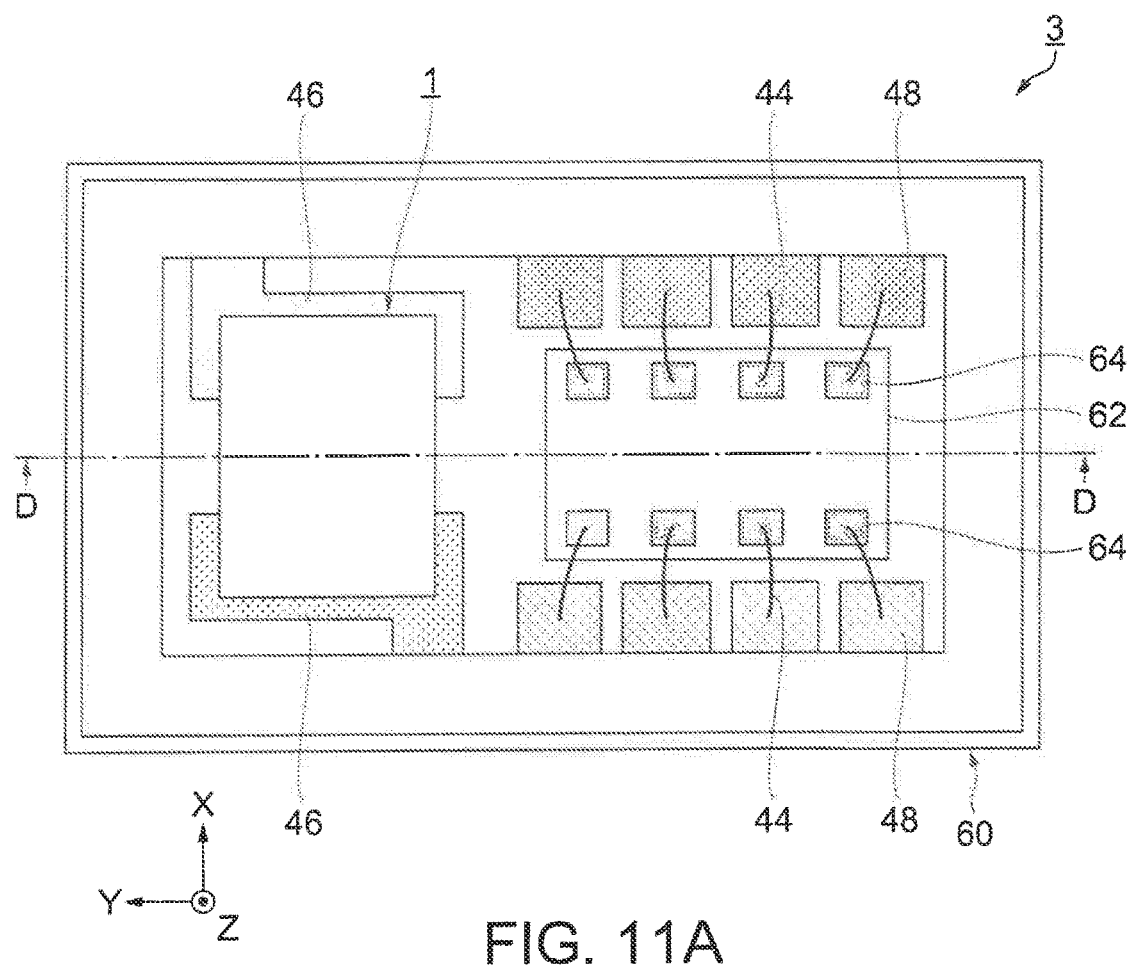
FIG. 11A is a plan view schematically illustrating the structure of an electronic device according to an embodiment of the invention.
Figure 11B:
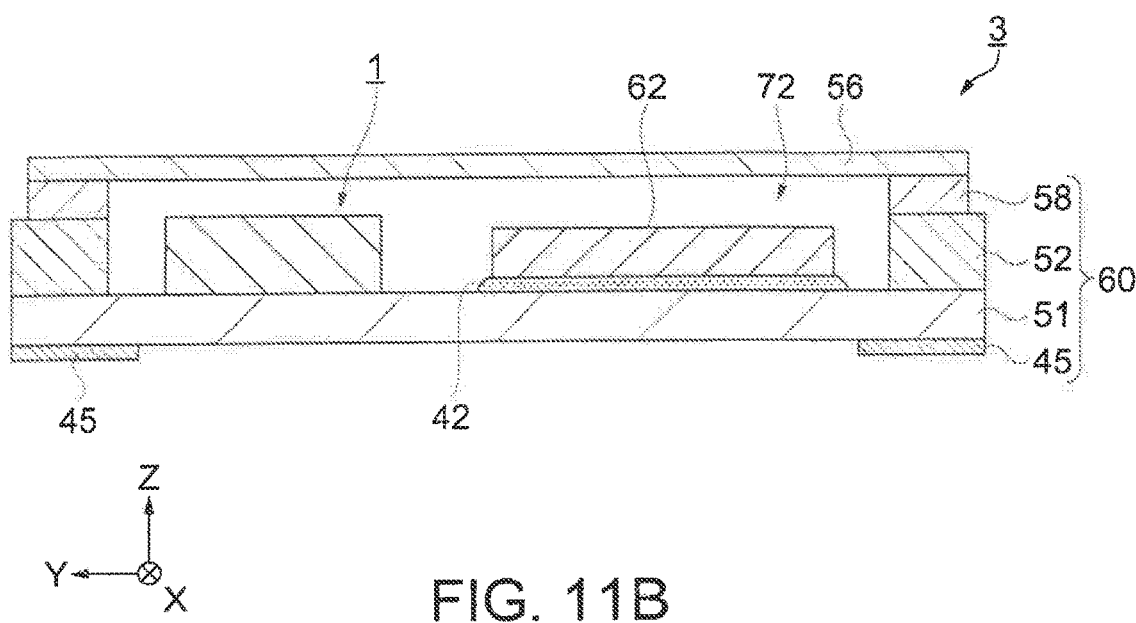
FIG. 11B is a cross-sectional view taken along the line D-D of FIG. 11A.

FIGS. 11A and 11B are schematic diagrams illustrating the structure of the electronic device according to the invention. FIG. 11A is a plan view and FIG. 11B is a cross-sectional view taken along the line D-D of FIG. 11A.

The electronic device 3 includes the resonator 1, an IC chip (chip component) 62 which includes an oscillation circuit for driving the resonator 1, a package body 60 which accommodates the resonator 1 or the IC chip 62, and the cover member 56 which is made of, for example, glass, ceramic, or metal.

As shown in FIG. 11B, the package body 60 is formed by laminating the first substrate 51, the second substrate 52, and the mounting terminal 45, similarly to the resonator 1 according to this embodiment. In addition, the package body 60 has a cavity 72 with an open upper surface. The inside of the cavity 72 in which the resonator 1 and the IC chip 62 are accommodated is airtightly sealed in a reduced-pressure atmosphere or an inert gas atmosphere, such as a nitrogen atmosphere.

A plurality of mounting terminals 45 are provided on the outer bottom of the first substrate 51. In addition, the mounting terminals 45 are electrically connected to connection electrodes 46 or connection terminals 48 which are provided on the upper surface of the first substrate 51 via through electrodes or interlayer wiring lines (not shown).

The resonator 1 and the IC chip 62 are accommodated in the cavity 72 of the package body 60. The resonator 1 is fixed to the connection electrodes 46 provided on the upper surface of the first substrate 51 through solder or a conductive adhesive. The IC chip 62 is fixed to the upper surface of the first substrate 51 through a bonding member 42, such as a brazing material or an adhesive. A plurality of connection terminals 48 are provided in the cavity 72. The connection terminals 48 are electrically connected to connection terminals 64 which are provided on the upper surfaces of the IC chip 62 by bonding wires 44.

The IC chip 62 includes a driving circuit (oscillation circuit) for controlling the driving of the resonator 1. When the IC chip 62 drives the resonator 1, it is possible to extract a signal with a predetermined frequency.

Electronic Apparatus

Next, electronic apparatuses to which the resonator 1 according to the invention is applied will be described in detail with reference to FIGS. 12 to 14.

Figure 12:
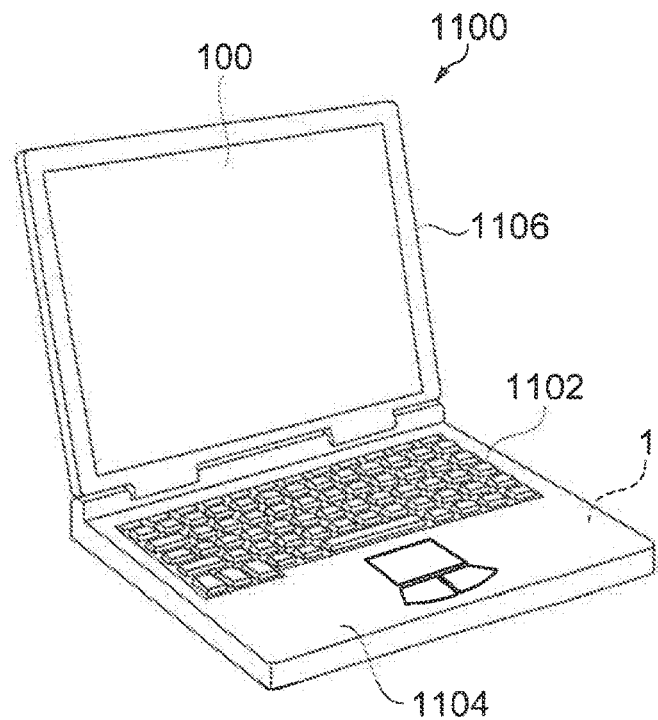
FIG. 12 is a perspective view illustrating the structure of a mobile (or laptop) personal computer as an electronic apparatus including the resonator according to the embodiment of the invention.

FIG. 12 is a perspective view illustrating the schematic structure of a mobile (or laptop) personal computer as the electronic apparatus including the resonator according to the embodiment of the invention. In FIG. 12, a personal computer 1100 includes a main body unit 1104 including a keyboard 1102 and a display unit 1106 including a display 100. The display unit 1106 is supported such that it can pivot about the main body unit 1104 through a hinge structure portion. The resonator 1 is provided in the personal computer 1100.

Figure 13:
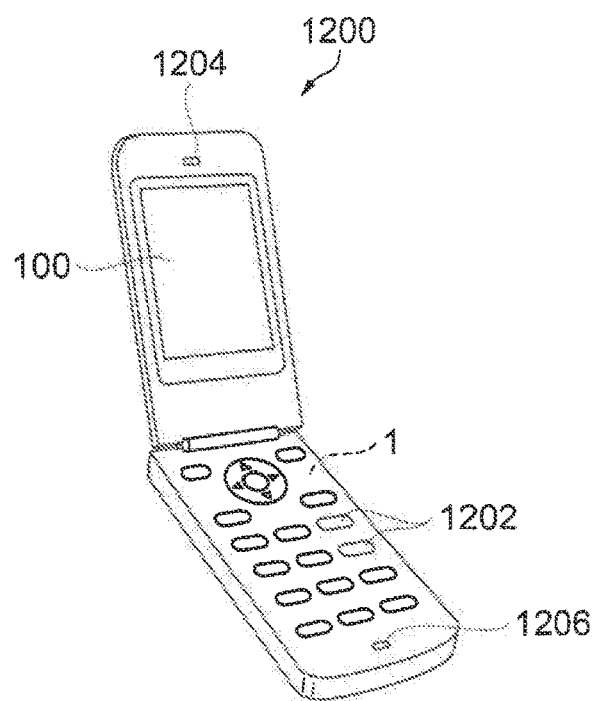
FIG. 13 is a perspective view illustrating the structure of a mobile phone (including a PHS) as the electronic apparatus including the resonator according to the embodiment of the invention.

FIG. 13 is a perspective view illustrating the structure of a mobile phone (including a PHS) as the electronic apparatus including the resonator according to the embodiment of the invention. In FIG. 13, a mobile phone 1200 includes a plurality of operation buttons 1202, an ear piece 1204, and a mouthpiece 1206. The display 100 is arranged between the operation buttons 1202 and the ear piece 1204. The resonator 1 is provided in the mobile phone 1200.

Figure 14:
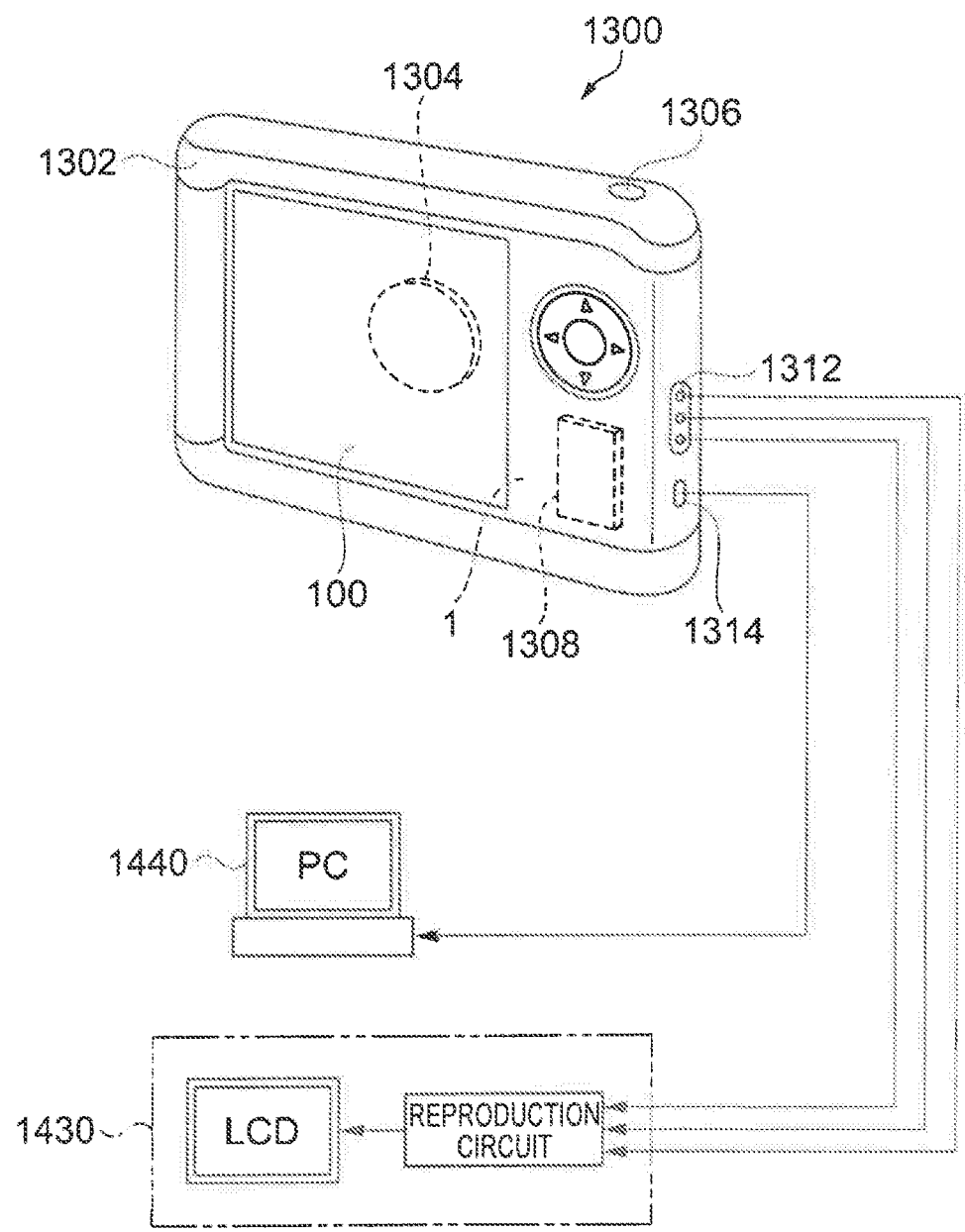
FIG. 14 is a perspective view illustrating the structure of a digital camera as the electronic apparatus including the resonator according to the embodiment of the invention.

FIG. 14 is a perspective view illustrating the structure of a digital camera as the electronic apparatus including the resonator according to the embodiment of the invention. In FIG. 14, connection to an external apparatus is shown briefly. In a general camera, a silver salt film is exposed to the optical image of an object. In contrast, a digital camera 1300 converts the optical image of an object into an electric signal using an imaging element, such as a charge coupled device (CCD), to generate an imaging signal (image signal).

A display 100 is provided on the rear surface of a case (body) 1302 of the digital camera 1300 and displays an image on the basis of the image signal obtained by the CCD. The display 100 functions as a viewfinder for displaying the object as an electronic image. Furthermore, a light receiving unit 1304 including, for example, an optical lens (imaging optical system) or a CCD, is provided on the front side (the rear side in FIG. 14) of the case 1302.

When a photographer checks an object image displayed on the display 100 and presses a shutter button 1306, the image signal obtained from the CCD at that time is transmitted and stored in a memory 1308. In the digital camera 1300, video signal output terminals 1312 and an input/output terminal 1314 for data communication are provided on a side surface of the case 1302.

As shown in FIG. 14, a television monitor 1430 and a personal computer 1440 are respectively connected to the video signal output terminals 1312 and the input/output terminal 1314 for data communication, if necessary. The image signal stored in the memory 1308 is output to the television monitor 1430 or the personal computer 1440 by a predetermined operation. The resonator 1 is provided in the digital camera 1300.

The electronic apparatus including the resonator 1 according to the embodiment of the invention is not limited to the personal computer (mobile personal computer) shown in FIG. 12, the mobile phone shown in FIG. 13, and the digital camera shown in FIG. 14, but the resonator 1 can also be applied to, for example, an ink-jet apparatus (for example, an ink jet printer), a laptop personal computer, a television, a video camera, a video cassette recorder, a car navigation system, a pager, an electronic organizer (including one with a communication function), an electronic dictionary, an electronic calculator, a computerized game machine, a word processor, a workstation, a video phone, a security video monitor, a pair of electronic binoculars, a POS terminal, a medical device (for example, an electronic thermometer, an electronic manometer, an electronic blood sugar meter, an electrocardiogram measurement instrument, an ultrasonograph, and an electronic endoscope), a fish detector, various types of measurement instruments, various types of gauges (for example, gauges for a vehicle, an aircraft, or a ship), and a flight simulator.

Moving Object

Next, a moving object to which the resonator 1 according to the embodiment of the invention is applied will be described.

Figure 15:
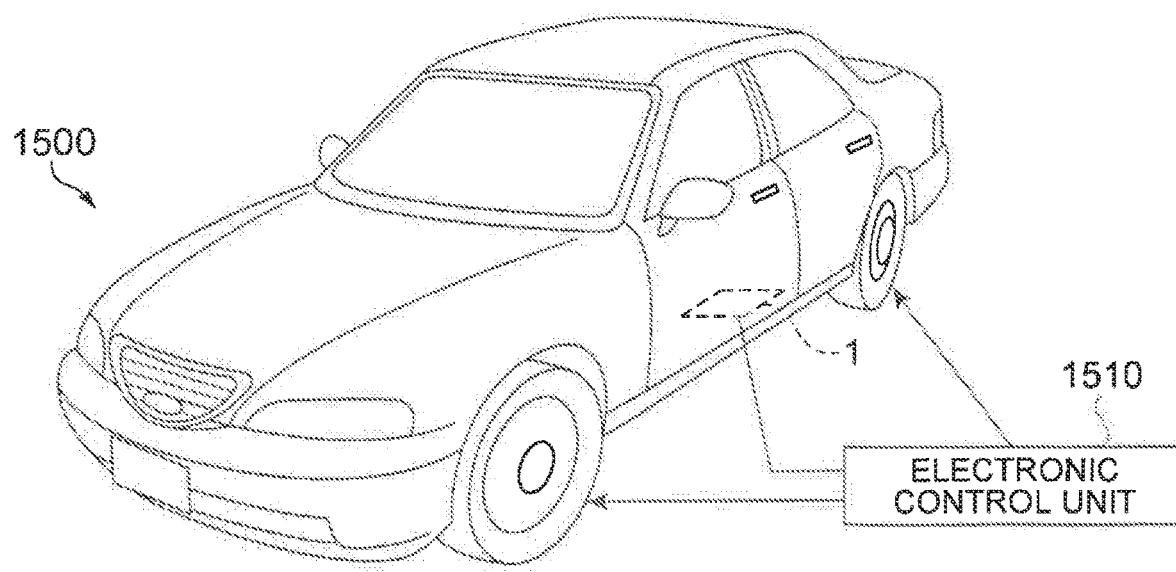
FIG. 15 is a perspective view illustrating the structure of a vehicle as a moving object including the resonator according to the embodiment of the invention.

FIG. 15 is a perspective view schematically illustrating a vehicle as an example of the moving object according to the embodiment of the invention. A vehicle 1500 includes the resonator 1. For example, the resonator 1 can be widely applied to an electronic control unit (ECU) 1510 for controlling a keyless entry system, an immobilizer, a car navigation system, a car air-conditioner, an anti-lock brake system (ABS), an air-bag system, a tire pressure monitoring system (TPMS), an engine controller, a battery monitor for a hybrid car or an electric car, and a vehicle posture control system.

The resonator 1, the resonator element 2, the electronic device 3, the electronic apparatus, and the moving object according to the invention have been described on the basis of the embodiments shown in the drawings. However, the invention is not limited thereto. The structure of each unit can be replaced with any structure with the same function. In addition, any other structures may be added to the invention. The embodiments may be appropriately combined with each other.

In the above-described embodiment or the modification examples, a quartz crystal is used as the material forming the resonator element. However, the material forming the resonator element is not limited thereto. For example, the following can be used: an oxide substrate made of aluminum nitride (AlN), lithium niobate ($LiNbO_3$), lithium tantalate ($LiTaO_3$), lead zirconate titanate (PZT), lithium tetraborate ($Li_2B_4O_7$), or langasite crystal ($La_3Ga_5SiO_{14}$); a laminated piezoelectric substrate obtained by laminating a piezoelectric material, such as aluminum nitride or tantalum pentoxide ($Ta_2O_5$), on a glass substrate; or piezoelectric ceramics.

In addition, the resonator element can be made of materials other than the piezoelectric material. For example, the resonator element can be made of a silicon semiconductor material. The vibration (driving) system of the resonator element is not limited to the piezoelectric driving. The resonator element may be, for example, an electrostatic driving type using electrostatic force or a Lorentz driving type using magnetic force other than the piezoelectric driving type using the piezoelectric substrate. In this case, it is possible to obtain the same structure and effect of the invention. In the specification and the drawings, the terms described together with the broader different terms or the synonymous different terms at least once can be replaced with the different terms in any parts of the specification or the drawings.

What is claimed is:

1. A resonator element comprising:
a base portion including a first end surface and a second end surface which is provided on a rear side of the first end surface; and
a pair of vibrating arms that protrude from the first end surface of the base portion in a first direction and are arranged in a line extending in a second direction perpendicular to the first direction, the vibrating arms each including a weight portion and an arm portion, the arm portion disposed between the weight portion and the base portion in plan view, a shortest distance Wb between the first end surface of the base portion and the second end surface of the base portion is selected so that the following are satisfied:

$$Q=\{(\rho \times C_p)/(c \times \alpha^2 \times \Theta)\} \times [\{1+(2 \times \rho \times C_p \times We^2 \times f/(\pi \times k))^2\}/(2 \times \rho \times C_p \times We^2 \times f/(\pi \cdot k))]$$

$0.81 \leq Wb/We \leq 1.70$, where Q is a Q-value of the resonator element, f is a vibration frequency [Hz] of the resonator element, We is an effective width [m], $\rho$ is mass density [kg/m$^3$], $C_p$ is heat capacity per unit mass at constant pressure [J/(kg×K)], c is an elastic constant [N/m$^2$] related to a direction perpendicular to a direction of Wb in a plane, $\alpha$ is a thermal expansion coefficient [1/K] related to a direction perpendicular to the direction of Wb in the plane, $\Theta$ is an environmental temperature [K], and k is thermal conductivity [W/(m×K)] related to the direction of Wb.

2. The resonator element according to claim 1,
wherein the shortest distance Wb is between 50 μm and 116 μm.

3. The resonator element according to claim 1,
wherein an overall length of the resonator element in the first direction is between 760 μm and 826 μm.

4. The resonator element according to claim 1,
wherein $0.91 \leq Wb/We \leq 1.30$ is satisfied.

5. The resonator element according to claim 1,
wherein $1.00 \leq Wb/We \leq 1.20$ is satisfied.

6. The resonator element according to claim 1,
wherein the weight portion has a width in the second direction wider than a width of the arm portion in the second direction.

7. The resonator element according to claim 1,
further comprising a supporting arm that protrudes from the base portion.

8. The resonator element according to claim 7,
wherein the supporting arm is provided between the pair of vibrating arms.

9. The resonator element according to claim 7,
wherein two supporting arms are provided, and the pair of vibrating arms are arranged between the two supporting arms in a plan view.

10. A resonator comprising:
the resonator element according to claim 1; and
a container that accommodates the resonator element.

11. A resonator comprising:
the resonator element according to claim 2; and
a container that accommodates the resonator element.

12. A resonator comprising:
the resonator element according to claim 3; and
a container that accommodates the resonator element.

13. An electronic device comprising:
the resonator element according to claim 1; and
a circuit.

14. An electronic device comprising:
the resonator element according to claim 2; and
a circuit.

15. An electronic device comprising:
the resonator element according to claim 3; and
a circuit.

16. A moving object comprising:
the resonator element according to claim 1.

17. A moving object comprising:
the resonator element according to claim 2.

18. A resonator element comprising:
a base portion including a first end surface and a second end surface which is provided on a rear side of the first end surface; and
a pair of vibrating arms that protrude from the first end surface of the base portion in a first direction and are arranged in a line extending in a second direction perpendicular to the first direction, the vibrating arms each including a weight portion and an arm portion, the arm portion disposed between the weight portion and the base portion in plan view,
a shortest distance Wb between the first end surface of the base portion and the second end surface of the base portion is selected so that a Q value of the resonator element is 6672 or above.

19. The resonator element according to claim 18, wherein the shortest distance Wb is between 50 μm and 116 μm.

20. The resonator element according to claim 18, wherein an overall length of the resonator element in the first direction is between 760 μm and 826 μm.

\* \* \* \* \*